US008551396B2

(12) United States Patent  (10) Patent No.: US 8,551,396 B2
Shivaram et al.  (45) Date of Patent: Oct. 8, 2013

(54) HYDROGEN STORAGE MATERIAL WITH INTERMEDIATE BOND STRENGTH AND PROCESS FOR MAKING THE SAME

(75) Inventors: Bellave S. Shivaram, Charlottesville, VA (US); Adam B. Phillips, Toledo, OH (US)

(73) Assignee: University of Virginia Patent Foundation, Charlottesville, VA (US)

( * ) Notice: Subject to any disclaimer, the term of this patent is extended or adjusted under 35 U.S.C. 154(b) by 901 days.

(21) Appl. No.: 12/595,978

(22) PCT Filed: Apr. 18, 2008

(86) PCT No.: PCT/US2008/060819
§ 371 (c)(1),
(2), (4) Date: Oct. 15, 2009

(87) PCT Pub. No.: WO2008/131220
PCT Pub. Date: Oct. 30, 2008

(65) Prior Publication Data
US 2010/0221137 A1  Sep. 2, 2010

Related U.S. Application Data

(60) Provisional application No. 60/925,153, filed on Apr. 18, 2007, provisional application No. 60/988,611, filed on Nov. 16, 2007, provisional application No. 61/031,552, filed on Feb. 26, 2008.

(51) Int. Cl.
*C22C 38/00* (2006.01)
*C22C 24/00* (2006.01)
*C22C 28/00* (2006.01)
*C22C 14/00* (2006.01)
*C22B 9/00* (2006.01)
*C22B 34/12* (2006.01)
*C22B 34/22* (2006.01)
*C22B 59/00* (2006.01)

(52) U.S. Cl.
USPC .............. 420/8; 420/400; 420/416; 420/417; 420/424; 420/441; 75/414; 75/433; 75/585; 75/610; 75/612; 75/622; 75/628

(58) Field of Classification Search
USPC ....... 420/8, 400, 416, 417, 424, 441; 75/414, 75/433, 585, 610, 612
See application file for complete search history.

(56) References Cited

U.S. PATENT DOCUMENTS

| | | |
|---|---|---|
| 6,306,339 B1 | 10/2001 | Kiyokawa |
| 6,328,821 B1 | 12/2001 | Ovshinsky |
| 6,683,783 B1 | 1/2004 | Liu et al. |
| 6,726,783 B1 | 4/2004 | Young |
| 6,746,645 B2 | 6/2004 | Ovshinsky |
| 6,830,725 B2 | 12/2004 | Fetcenko |
| 6,875,536 B2 | 4/2005 | Ovshinsky |
| 7,029,600 B2 | 4/2006 | Ovshinsky |
| 7,101,530 B2 | 9/2006 | Pez |
| 7,108,757 B2 | 9/2006 | Huang et al. |
| 7,118,611 B2 | 10/2006 | Snow |
| 7,166,150 B2 | 1/2007 | Torgersen |
| 7,175,826 B2 | 2/2007 | Lemmon |
| 7,250,146 B2 | 7/2007 | Hu |
| 7,250,386 B2 | 7/2007 | Ovshinsky |
| 7,329,399 B2 | 2/2008 | Camaro |
| 2004/0213998 A1 | 10/2004 | Hearley |
| 2006/0292065 A1 | 12/2006 | Wolverton |
| 2007/0092395 A1 | 4/2007 | Rijssenbeek |
| 2008/0020248 A1 | 1/2008 | Sridhar |

OTHER PUBLICATIONS

K. Hirano, J. Kadano, S. Yamamoto, T. Tanabe and H. Miyake, J. Alloys and Compounds, 408-412, 351 (2006).
O. Gulseren, T. Yildirim, and S. Ciraci, Phys. Rev. Lett, 87, 2001, 037001.
R.F. Schmitt, J.W. Allen, and R. Wright, Sens. Actuators B76, 80 (2001).
T. Yildirim, Jorge Iniguez, and S. Ciraci, Phys. Rev. B 72, 153403, 2005.
Qiang Sun, Puru Jena, Qian Wang, and Manuel Marquez, J. Amer. Chem. Soc., 128, 9741-9745, 2006.
Yong-Hyun Kim, Yufeng Zhao, Andrew Williamson, Michael J. Heben, and S. B. Zhang, Phys. Rev. Lett., 96, 016102 (2006).
N. Akman, E. Durgun, T. Yildirim, and S. Ciraci, J. Phys., Cond. Mat. 18, 9509 (2006).
Hoonkyung Lee, Woon Ih Choi, and Jisoon Ihm, Phys. Rev. Lett., 97, 056104 (2006).
S. Li and P. Jena, Phys. Rev. Lett., 97, 209601 (2006).
Durgun, S. Ciraci,W. Zhou, and T. Yildirim, Phys. Rev. Lett, 97,226102 (2006).
W. Zhou,T. Yildirim, E. Durgun and S. Ciraci, Phys. Rev. B 76, 085434 (2007).
Philippe F. Wecka, T. J. Dhilip Kumar, Eunja Kim, and Naduvalath Balakrishnan, "Computational study of hydrogen storage in organometallic compounds", J. of Chem. Phys., 126, 094703, 2007.
Yufeng Zhao, Yong-Hyun Kim, A. C. Dillon, M. J. Heben, and S. B. Zhang, "Hydrogen Storage in Novel Organometallic Buckyballs", Phys. Rev. Lett., 94, 155504 (2005).
Yu Kang Lee, Laurent Manceron, Imre Papai, J. Phys. Chem. A ,101, 9650-9659, 1997.
Paul S. Cremer, Xingcai Su, Y. R. Shen, and Gabor A. Sommjai, J. Amer. Chem. Soc., 118, 2942-2949, 1996.
H.-G. Cho and L. Andrews, J. Phys. Chem. A 108, 6272 (2004).
G.A. Ozin, W.J. Power, T.H. Upton, and W. A. Goddard III, J. Am. Chem. Soc. 100, 4750, (1978).

(Continued)

*Primary Examiner* — Joseph K. McKane
*Assistant Examiner* — Amanda L Aguirre
(74) *Attorney, Agent, or Firm* — Robert J. Decker

(57) ABSTRACT

Provided herein are materials that can achieve up to 14% hydrogen absorption by weight in ambient conditions, which is a marked improvement over the hydrogen absorption values found in the prior art. Further provided are experimental conditions necessary to produce these materials. In order to produce the hydrogen storage material, a transition metal (or Lithium) is vaporized in a pi bond gas in conditions that permit only a few bonding collisions to occur between the vaporized transition metal atoms and pi bond gas molecules before the resulting bonded material is collected.

18 Claims, 12 Drawing Sheets

(56) References Cited

OTHER PUBLICATIONS

T.A. Land, T. Michely, R.J. Behm, J.C. Hemminger, and G. Comsa, J. Chem. Phys. 97, 6774 (1992).
F. Zaera and C. French, J. Am. Chem. Soc. 121, 2236 (1999).
L.H. Dubois, D.G. Castner, and G.A. Somorjai, J. Chem. Phys. 72, 5234 (1980).
D. Ritter, J.J. Carroll, and J.C. Weisshaar, J. Phys. Chern. 96, 10636 (1992).
J.J. Carroll, K.L. Huog, and J.C. Weisshaar, J. Am. Chem. Soc. 115, 6962 (1993).
J.J. Carroll, K.L. Huog, J.C. Weisshaar, M.R.A. Blomberg, P.E.M. Siegbahn, and M. Svensson, J. Phys. Chem. 99, 13955 (1995).
P.A. Willis, H.U. Stauffer, R.Z. Hinricks, and H.F. Davis, J. Phys. Chern. A 103, 3706 (1999).
H.H. Hwu and J.G. Chen, J. Phys. Chern. 107, 11467 (2003).
Y.K. Lee, L. Manceron, and I. Papal, J. Phys. Chern. A 101 9650 (1997).
Louis Schlapbach, & Andreas Ziittel, Nature, 414, 2001, 353-358.
G.W. Crabtree, M.S. Dresselhaus, and M.V. Buchanan, Phys. Today 57, No. 12, 39 (2004).
Sunita Satyapal, John Petrovic and George Thomas, Scientific American, Apr. 2007, p. 81.
B.C. Guo, K.P. Kerns, and A.W. Castleman Jr., J. Phys. Chem. 1992, 96, 4879-4883.
B. C. Cuo, K. K P. Kerns, and A. W. Castleman, Jr., Science, 255, 1411, 1992.
B. Kiran, Anil Kandalam and P.Jena, J. Chern Phys., 124, 224703 (2006).
G.S. Fu, Y.L. Wan, L.Z. Chu, Y Zhou, W. Yu, L. Han, and Y.C. Peng, Europhys. Lett 69, 758, (2005).
A. Krozer and B. Kasemo, J. Less-Common Metals 160, 323 (1990).
P. Hjort, A. Krozer, B. Kasemo, J. Alloys Compd. 234, L11 (1996).
K. Papathanassopoulos and H. Wenzl, J. Phys. F: Met. Phys. 12, 1369 (1982).
T. Ono, X. Li, H. Miyashita, and M. Esashi, Rev. Sci. Instrum. 74, 1240 (2003).
K. Srinivasan, S. Cular, V.R. Bhethanabotla, S.Y. Lee, M.T. Harris, and J.N. Culver, IEEE Ultrasonics Symp. 645, 1, (2005).
A.Z. Sadek, C.O. Baker, D.A. Powell, W. Wlodarski, R.B. Kaner, and K. Kalantar-zadeh, IEEE Sensors Journal, 7, 213 2007.
A.J. Ricco, A.W. Staton, R.M. Crooks, and T. Kim, Faraday Discuss, 107, 247 (1997).
E. Milella and M. Penza, Thin Solid Films 327-329, 694 (1998).
S.L. Hietala, V.M. Hietala, and C.J. Brinker, IEEE Trans. Ultrasonics, Ferroelectrics, and Freq. Control 48, 262 (2001).
A.A.V. Gibson, J.R. Owers-Bradley, I.D. Calder, J.B. Ketterson, and W.P. Halperin, Rev. Sci. Instrum. 52, 1509 (1981).

6(a)            6(b)

9(a)   9(b)

10(a)            10(b)

HYDROGEN STORAGE MATERIAL WITH INTERMEDIATE BOND STRENGTH AND PROCESS FOR MAKING THE SAME

CROSS REFERENCE TO RELATED APPLICATIONS

The present invention is a national stage filing of International Application No. PCT/US2008/060819, filed Apr. 18, 2008, which claims priority under 35 U.S.C. §119(e) from U.S. Provisional Application Ser. No. 60/925,153, filed Apr. 18, 2007, entitled "Super Rich Hydrogen Storage NanoMaterials with Intermediate Bond Strength," U.S. Provisional Application Ser. No. 60/988,611, filed Nov. 16, 2007, entitled "Super Rich Hydrogen Storage NanoMaterials with Intermediate Bond Strength," and U.S. Provisional Application Ser. No. 61/031,552, filed Feb. 26, 2008, entitled "Super Rich Hydrogen Storage NanoMaterials with Intermediate Bond Strength," of which the entire disclosures are herby incorporated by reference herein in their entirety.

GOVERNMENT SUPPORT

Work described herein was supported by Federal Grant No. NSF Grant No. DMR-0073456, awarded by the National Science Foundation. The United States Government has certain rights in this invention.

BACKGROUND OF THE INVENTION

1. Industry Characteristics

Hydrogen storage is a way to store energy that competes with batteries. Both batteries and hydrogen store energy in chemical form and need a device to convert the energy to heat or mechanical work. Fuel cells and combustible engines are two main devices that convert hydrogen into electricity through the combining with oxygen. In automobiles, the gas tank can be replaced with a hydrogen tank and the automobile can still work. A strong incentive exists in the United States and elsewhere, however, to find alternative energy means to power automobiles, due to pollution problems and other obvious problems with using gasoline. Of the alternative energy sources, ethanol is inadequate because ethanol still pollutes. Generating hydrogen ($H_2$) and electricity for batteries may also pollute, but this can be done at a central location and thus can be handled more easily. Furthermore, ethanol still needs 15% gasoline to start the car and warm it up. Regarding batteries, they are not yet efficient enough to power automobiles on their own. An effective way of utilizing hydrogen as a fuel in a car did not exist before the present invention.

The ability to use hydrogen as an alternative fuel source instead of gasoline hinges on the creation of materials that can adequately store hydrogen in ambient settings. Currently, the materials that exist do not store hydrogen in adequate amounts. No one has been able to develop a hydrogen storage device that has met the standards put forth by the U.S. Department of Energy. Therefore, a convenient and economical storage system for hydrogen fuel does not exist.

Hydrogen storage technologies face a number of exemplary challenges: 1) the ability to store enough hydrogen for a vehicle to have a driving range equal to or better than that provided by a tank of gasoline; 2) ability to be sufficiently light and compact so as not to change the efficiency of the vehicle; and 3) ability to be economical to provide motivation for switching from gasoline. One persistent problem that has prevented using hydrogen effectively in vehicles has been low gravimetric density. Once these challenges are overcome, hydrogen fuel technologies could quickly become adopted into the mainstream marketplace. Regarding the amount of Hydrogen that must be absorbed by the material before it is considered to be commercially viable, the United States Department of Energy set this standard at 6% of system weight.

In addition to hydrogen storage capacity, a second important parameter that governs the usefulness of a hydrogen storage material is the speed with which the material can take up and discharge hydrogen. This means that the kinetics governing the hydrogen absorption process also has to be favorable.

2. Theory and Problems in the Art

Although a large number of compounds with high hydrogen content actually exist, these compounds have severe limitations. One category of compounds with high hydrogen content is metal hydrides, which are materials that contain strong chemical bonds (i.e. the Hydrogen is absorbed chemically). While these materials can have large hydrogen content, they do not release hydrogen until taken to elevated temperatures, which is a characteristic that limits their practical utility. Another category of compounds with high hydrogen content are physisorbants, which are materials that absorb hydrogen physically, not chemically. While these materials have the ability to release hydrogen at modest temperatures, they do not have the capacity for high hydrogen content under ambient conditions, as the hydrogen only remains bound to the compound at extremely low temperatures. Therefore, physisorbants also have practical limitations.

Carbon-based materials are attractive for hydrogen storage because of their light mass, abundance, favorable chemistry, and high hydrogen content. The challenge in using these materials, however, lies in preserving the hydrogen entrained in its molecular form while at the same time allowing for a large number of hydrogens to desorb near room temperature. In order to meet this goal, several theoretical groups have focused on applying first principles quantum mechanics to various carbon systems with metal atoms. Such work stems from early observations of Kubas that the interaction energy between a carbon-metal complex and hydrogen suggests near room temperature desorption. (1). As a result of these theories regarding carbon-based materials, carbon nanotubes, buckyballs, metcars, and carbon containing polymers have been theoretically studied. (2). Many of these materials are predicted to absorb hydrogen in excess of 6 wt %. But there have also been counter-suggestions that a clustering of metal atoms would degrade the absorption ability of the carbon-based material. (3) Durgun and collaborators recently proposed that transition metals (such as titanium) in reaction with ethylene should form new complexes that have the potential to absorb as many as 5 hydrogen molecules per transition metal atom (4). These are just theoretical abstractions, and prior to this invention, no one has been able to use these theoretical abstractions to actually create a material that is able to absorb and desorb a substantial amount of hydrogen quickly in ambient conditions.

Table 1 shows various predicted hydrogen uptake values that could theoretically result from mixing different transition metals (and lithium) with various carbon-based complexes. (5) However, yet again, no one has been able to actually create a material that is able to absorb and desorb a substantial amount of hydrogen quickly in ambient conditions.

TABLE 1

| Metal | Precursor | Complex | Max #wt % | Binding Energy (electron Volt)/$H_2$ |
|---|---|---|---|---|
| Sc | Ethylene | $Ti_2C_2H_4(H_2)_{10}$ | 14.5 | 0.39 |
| Sc | Ethylene | $TiC_2H_4(H_2)_5$ | 12 | 0.39 |
| Ti | Ethylene | $Ti_2C_2H_4(H_2)_{10}$ | 13.9 | 0.45 |
| Ti | Ethylene | $TiC_2H_4(H_2)_5$ | 11.6 | 0.45 |
| Ti | Cyclobutane | $TiC_4H_4(H_2)_5$ | 9.10 | 0.33 |
| Sc | Cyclobutane | $ScC_4H_4(H_2)_5$ | 9.3 | 0.33 |
| Sc | Benzene | $ScC_6H_6(H_2)_n$ | 6 | 0.40 |
| Ti | Benzene | $TiC_6H_6(H_2)_n$ | 6 | 0.69 |
| V | Benzene | $VC_6H_6(H_2)n$ | 4.4 | 0.83 |
| Sc | $C_{60}$ | $Sc_{12}C_{60}$ | 7.0 | 0.35 |
| Sc | $C_{48}B_{12}$ | $Sc_{12}C_{48}B_{12}$ | 8.77 | 0.35 |
| Li | $C_{60}$ | $Li_{12}C_{60}$ | 13 | 0.075 |

Many have tried to create various transition metal-ethylene systems for purposes other than hydrogen storage. No one has been able successfully identify a transition metal-ethylene complex of practical use for hydrogen storage until the present inventors. Even more, some have tried to create transition metal-ethylene complexes that simply exhibit a hydrogen uptake value of greater than 0, let alone create a system that matches the theoretical predictions, but all have failed. For example, Lee, Manceron, and Papai found a strongly bound $Ti(C_2H_4)$ system, and similar $H_2Ti(C_2H_2)$ and $HTi(C_2H_3)$ systems. (6) However, their IR absorption experiments reported negative results for $Ti(C_2H_4)$. Ozin produced a Nickel-ethylene system, and Kafafi tested n Iron-ethylene system. Despite the efforts of others in the field to produce a Transition metal-ethylene system, to our knowledge, no experimental reports exist showing that a room temperature hydrogen absorbing material has ever been developed. (7) In other words, despite the proposed theories, no one has been able to actually create a material and demonstrate that it can effectively absorb and desorb a high amount of hydrogen at room temperature.

Results from prior testing of transition metal-ethylene complexes (in both the gas phase and on surfaces) suggest that two types of transition metal ethylene structures can be formed. Spectroscopic studies of transition metals and ethylene co-deposited in a solid argon matrix show a pi complex for several transition metals, including nickel (Ni), palladium (Pd), and titanium (Ti) (8). A similar bonding mechanism has been found on Pt(111) surfaces at low temperatures (9) and vibration studies have found evidence of the structure at room temperature on those surfaces as well (10) The pi structure has also been observed through ground state transition metal atoms reacting with ethylene. (11) In these studies, the transition metal atoms were created through laser ablation and thermalized in a helium gas. Once cooled, the ethylene was injected into the plume. A second type of structure with a sigma bond is known to form. (12) Additionally, solid argon studies show that this is the preferred structure for ethylene bonding to some of the transition metals. (13) The same preferential results were found through some laser ablation studies. (14)

It should be appreciated that all previous uses of transition metals in the context of hydrogen storage in patents have been as catalysts. The transition metals dissociate molecular hydrogen at room temperature, especially Pd, Pt, and Ni. The atomic hydrogen can then be absorbed by whatever material is being used for hydrogen storage. Specifically, U.S. Pat. No. 7,101,530, "Hydrogen storage by reversible hydrogenation of pi-conjugated substrates," of which is hereby incorporated by reference in its entirety, uses transition metals to dissociate molecular hydrogen into atomic hydrogen, which then bonds to carbon atoms at lower temperatures than the substrates would without transition metals. In contrast, the present invention does not use the transition metal as a catalyst.

In contrast, the present invention implements a transition metal as an actual element of the hydrogen storage material. The transition metal is not a catalyst that aids in dissociating molecular hydrogen to atomic hydrogen.

Many have tried to follow various scientific theories to produce experimental conditions that result in materials that absorb high quantities of hydrogen at room temperature. Everyone, up until the present inventors, has failed in pursuit of this goal.

SUMMARY OF THE INVENTION

The identification of new materials with ability to absorb large quantities of hydrogen under ambient conditions is an important aspect of making clean energy widely available. At a fundamental level, there are no known limits to the degree of storage achievable using such materials. Therefore, at issue is the discovery of new materials with properties desirable for hydrogen storage. These properties are (i) high capacity absorption at room temperature, (ii) desorption at moderate temperature, (iii) rapid kinetics, and (iv) zero degradation with repeated cycling. Heretofore, no one material existing prior to the present invention was able to meet all four requirements. The present invention has met requirements (i) and (iii), at a minimum, and potentially meets the requirements (ii) and (iv) as well. (15)

The inventors have invented materials that, among other things, can achieve up to about 14% hydrogen absorption by weight in ambient conditions, which is a marked improvement over the Hydrogen absorption values found in the prior art. Furthermore, the inventors have discovered, but not limited thereto, the method and experimental conditions necessary to produce these materials, which entails mixing a vaporized transition metal (or Lithium) with a pi bond gas in conditions where very few collisions occur between the vaporized transition metal atoms and pi bond gas molecules.

This new class of invented hydrogen storage materials identified by the inventors falls between the ranges seen in chemically absorbed hydrogen and physically absorbed hydrogen. An intermediate strength bonding of hydrogen in both atomic and molecular states occurs, and the materials have intermediate bonding energies. The materials have the capability of achieving up to 14% hydrogen absorption by weight. The optimum deposition conditions that produce this 14% hydrogen absorption value have also been established. Under less optimal conditions, hydrogen absorption is systematically downgraded. This 14% Hydrogen uptake value far exceeds the 6% commercial viability standard set forth by the U.S. Department of Energy. Also, this high absorption value (of 14%) occurs at ambient temperatures and moderate hydrogen pressure. Remember, problems associated with physisorbants and metal hydrides were that these materials can only be utilized in at extreme temperatures.

An important aspect of the invented materials is the conditions under which the materials are created. The conditions that produce the invented materials are such that the materials form in very few collisions between vaporized transition metal atoms and pi bond gas molecules. One important condition critical to the formation of the invented material is the pressure of the pi bond gas during the vaporization/ablation of the transition metal. The inventors have discovered that lower pi bond gas pressures produced materials with higher absorption uptake capabilities, and that vaporizations/ablations at higher pi bond gas pressures resulted in the material having a lower hydrogen uptake rate. Another important condition is the distance between the transition metal source and the substrate where the particles are collected. The number of collisions between the transition metal and the pi bond gas molecules at a fixed pressure can be controlled by changing the distance. Farther distances will result in more collisions and thus lower the hydrogen uptake, while closer distances will result in fewer collisions and a higher hydrogen uptake. Additionally, the incident energy used to vaporize the transition metal is another critical condition in making the invention. The higher the incident energy, the faster the transition metal atoms move, and the less time they have to collide with the pi bond gas molecules. Therefore, situations of higher incident energy lead to higher hydrogen uptake. On the other hand, the lower the incident energy, the slower the transition metal atoms move, and the more time they have to collide with the pi bond gas molecules. Therefore, situations of lower incident energy lead to lower hydrogen uptake. In one aspect of an embodiment of the present invention, the incident energy is the laser power.

In sum, the present invention is created when a transition metal is mixed with a pi-bond gas in conditions where very few collisions occur between the vaporized transition metal atoms and the pi bond gas molecules. The experimental conditions that most strongly influence whether or not a low number of bonding collisions occur are (1) the pi-bond gas pressure, (2) the distance between the transition metal and the substrate where the particles are collected, and (3) the incident energy used to vaporize the transition metal. The inventors discovered the relationship between these conditions that leads to a low number of bonding collisions between the vaporized transition metal atoms and the pi bond gas molecules. The material that results when the transition metal and pi bond gas are mixed these conditions is the hydrogen storage material with the high hydrogen uptake.

It is worth noting that the conditions leading to few bonding collisions between the vaporized transition metal atoms and the pi bond gas molecules can be manipulated in proportion to each other to produce the present invention. For example, the inventors, given their laboratory setup, operate under certain pressures, distances, and incident energies. In another laboratory setup, an individual might choose to use a much larger distance between the transition metal and the substrate where the particles are collected. If this is the case, this individual could easily adjust the incident energy and the pi bond gas pressure to produce an environment where a low number of bonding collisions occur, and the invented material is produced. Therefore, the invention can be practiced on a wide variety of laboratory equipment and setups.

It is important to note that as long as the proper set of conditions that produce a low number of bonding collisions is known, vaporization of the transition metal in these conditions will always result in presently desired invented material. Furthermore, the conditions that drive the process (the pi bond gas pressure, distance, and incident energy) can be manipulated in relation to each other in a variety of ways to produce a low number of bonding collisions. The lower the number of bonding collisions that occur during the formation of the hydrogen storage material, the higher the hydrogen uptake will be. As the number of bonding collisions that occur during the formation of the hydrogen storage material decreases, the hydrogen uptake value will also decrease.

The importance of the inventors discovering the conditions that produce a low number of bonding collisions and actually making a material with a positive hydrogen uptake that can operate at room temperature cannot be understated.

The characteristics and absorption values associated with presently invented hydrogen storage materials are nearly identical to the theoretically predicted hydrogen uptake values for transition metal-pi bond gas complexes operating in moderate temperatures and pressures. Table 2 shows both the inventors experimental results for their titanium-ethylene and titanium-benzene complexes, as well as the theoretically predicted results for both complexes. (16)

TABLE 2

| Metal | Precursor | Complex | Theoretical Max hydrogen uptake wt % (never realized or obtained in practice before present invention) | Experimentally observed hydrogen uptake wt % of the present invention |
|---|---|---|---|---|
| Ti | Ethylene | Titanium-Ethylene | 13.9 | 14 |
| Ti | Benzene | Titanium-Benzene | 6 | 5.9 |

Another important aspect of an embodiment of the present invention is that the kinetics of absorption at room temperature have been established. Within a time of 120 seconds, nearly two-thirds of the maximum hydrogen content is absorbed. Such rapid kinetics suggests that one aspect of an embodiment of the present invention is a nanomaterial that is molecularly dispersed.

The present invention solves the problems found in the prior art, and is an improvement over the prior art, because, among other things, it provides a hydrogen bonding mechanism while still satisfying the requirements of high hydrogen content. The invention is distinct from other known carbon-based materials because, but not limited thereto, these prior art materials only exhibit a hydrogen absorption capacity of only a few percent, they do not possess fast kinetics and also require enormous pressures (sometimes up to 100 atmospheres) in order to reach their full uptake capacity. Whereas, the present invention exhibits a high hydrogen absorption capacity of up to about 14%, possesses fast kinetics, and can operate at ambient pressures and temperatures. The invention also, according to theoretical principles, enables easy release at a favorable temperature. Another advantage of the present invention is that it can be produced using relatively inexpensive starting material in few steps.

Various embodiments of the present invention may be used, but is not limited thereto, to store or transport energy in the home, in cars, land vehicles, tools, devices, equipment, air and space vehicles, watercraft, or any systems that require power for intended use. For instance, any the uses may be applied for a variety of purposes, such as military, commercial, residential or as desired or required. Regarding home use, currently individuals obtaining energy from solar panels sell the extra electricity generated during the day to the power company. But at night, electricity is provided to these individuals by the power company. If this excess energy is used to create hydrogen that could be stored safely, one would not need to buy power form the power company at night. Thus the investment in solar power would be even more economically favorable. The present invention could also be used as a way to make solar power more commercial. With relatively inexpensive materials for hydrogen storage, an addition to a residential solar system would not be cost prohibitive and would add more usable output power to the user.

Regarding the usefulness of the invention as fuel for cars, the problem with hydrogen in cars has been low gravimetric density. But the 14 wt % achieved by the present invention would eliminate this problem. The present invention could also be useful for neighborhood power, or other portable or remote power as desired or required.

An aspect of an embodiment of the present invention provides a process for producing a hydrogen storage material. The method may comprise: vaporizing a transition metal (type as desired or required) or Lithium (Li) in a pi-bond gas (type as desired or required), in conditions causing a low number of bonding collisions between the atoms of the transition metal or Lithium and the pi-bond gas before resulting bonded product is collected. The process for producing a hydrogen storage material is accomplished wherein the material can exhibit a $H_2$ uptake of greater than zero at any temperature up to desorption temperature. While any positive uptake is novel and useful, various ranges of hydrogen absorption efficiency are possible depending on the conditions that produce the material. In an optimum exemplary embodiment for instance, but not limited thereto, the hydrogen storage material exhibits a hydrogen uptake of about 14%.

An aspect of an embodiment of the present invention provides a hydrogen storage material produced by: vaporizing a transition metal (a type as desired or required) or Lithium in a pi-bond gas (a type as desired or required) in conditions causing a low number of bonding collisions between the atoms of the transition metal or Lithium and the pi-bond gas before resulting bonded product is collected. The material can exhibit a $H_2$ uptake of greater than zero at any temperature up to desorption temperature.

Some of the transition metals that may be used in the present invention, but not limited thereto are Titanium (Ti), Nickel (Ni), Niobium (Nb), Iron (Fe), Scandium (Sc) or Vanadium (V). Some of the pi-bond gases that may be used in the present invention, but not limited thereto, are ethylene ($C_2H_4$), benzene ($C_6H_6$), or acetylene ($C_2H_2$).

These and other objects, along with advantages and features of the invention disclosed herein, will be made more apparent from the description, drawings, and claims that follow.

BRIEF DESCRIPTION OF THE DRAWINGS

The accompanying drawings, which are incorporated into and form a part of the instant specification, illustrate several aspects and embodiments of the present invention and, together with the description herein, and serve to explain the principles of the invention. The drawings are provided only for the purpose of illustrating select embodiments of the invention and are not to be construed as limiting the invention FIG. 1 schematically illustrates an embodiment of the present invention comprising the dual ablation laboratory design used create the invented materials.

FIG. 11 schematically illustrates a kinetic diagram for PLD ablation showing the three regions between the target and the substrate where the ejected atom can pass through.

DETAILED DESCRIPTION OF EXEMPLARY EMBODIMENTS

An aspect of various embodiments of the present invention pertains to, for example, and not limited thereto, a metal belonging to the transition metal group in the periodic table in vaporized atomic form inside a high vacuum chamber and made to react with carbon containing pi-bond gases such as alkenes and ring compounds. The resultant reactant products are deposited on a cold substrate, from where they can be gathered for further processing and storage.

Figure 1:
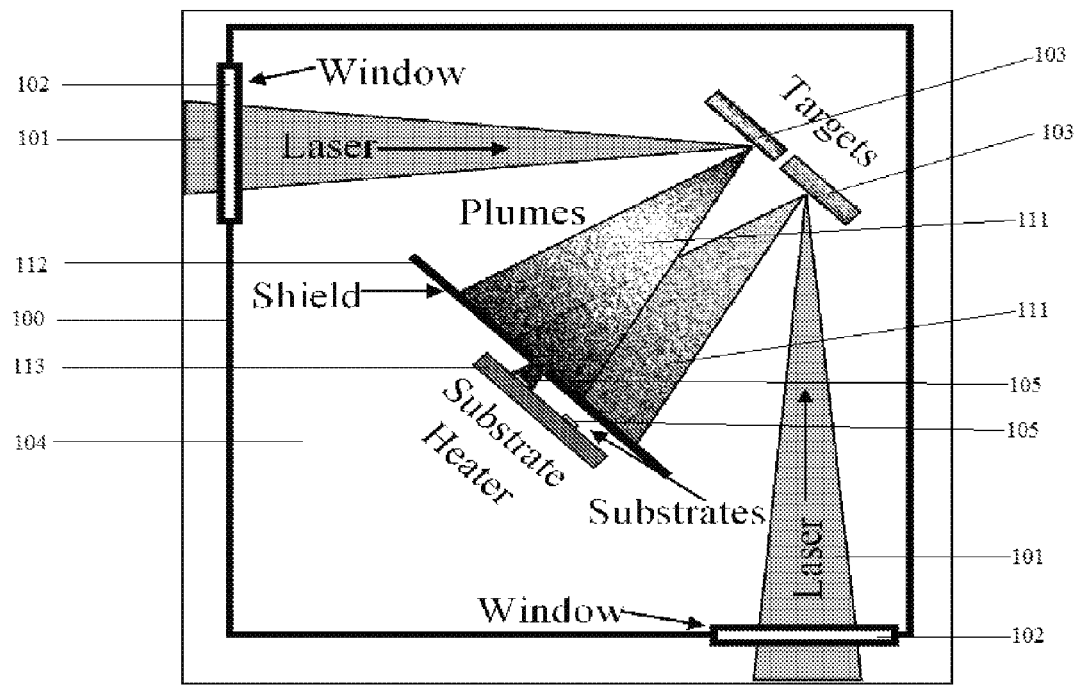

FIG. 1 schematically illustrates this process in dual-ablation form. FIG. 1 shows the chamber 100 (or applicable housing) where the hydrogen storage material is formed 100. The laser beam 101 enters the chamber 100 through the window 102 and is directed at the target 103, such transition metal or lithium 103. The beam 101 ablates, or vaporizes the transition metal or lithium 103, thus transforming the transition metal or lithium from a solid to a gas. The vaporized transition metal then mixes with the pi-bond gas 104 in the chamber 100 forming a plume 111. A shield 112 may be implemented, for example if practicing dual (multi-) ablation (multiple samples, for example for different types of materials). The plume 111 passes through the shield 112, which may be moved, rotated, or tilted. A heater 113 (or applicable heat source) for the substrate for instance, may be implemented as well, for varying the temperature. The new hydrogen storage material formed is collected on the substrate 105. It should be appreciated that the laser beam is only one way to vaporize the transition metal. Other available or desired energy sources (e.g., electron beam, etc.) may be implemented for vaporization methods. A characteristic of the vaporization process by the laser beam or applicable energy source is the incident energy. The distances between any of the aforementioned components may be varied or adjusted as desired or required. Further, the angles, alignments, contours, etc. of any of the aforementioned components may be varied or adjusted as desired or required.

The role of the transition metal is to bond to the hydrogen. The pi-bond gas acts to keep the transition metal atoms from agglomerating into particles. For example, titanium (a transition metal) has six bond sites. So theoretically, if one Titanium atom could be isolated, it could bond with six hydrogen molecules. But one titanium cannot be isolated by the inventors (or anyone else for that matter) because the titanium atoms form particles that limit the number of hydrogens that can bond. The pi-bond gas (e.g. ethylene) isolates the titanium and only occupies one bonding site. So while this system does not absorb the maximum possible number of hydrogens (which would be the case if all six bonding sites were available), it can still absorb a large amount of hydrogen (since five bonding sites are available). Furthermore, the fact that ethylene is light contributes to a high hydrogen uptake percentage.

Figure 2:
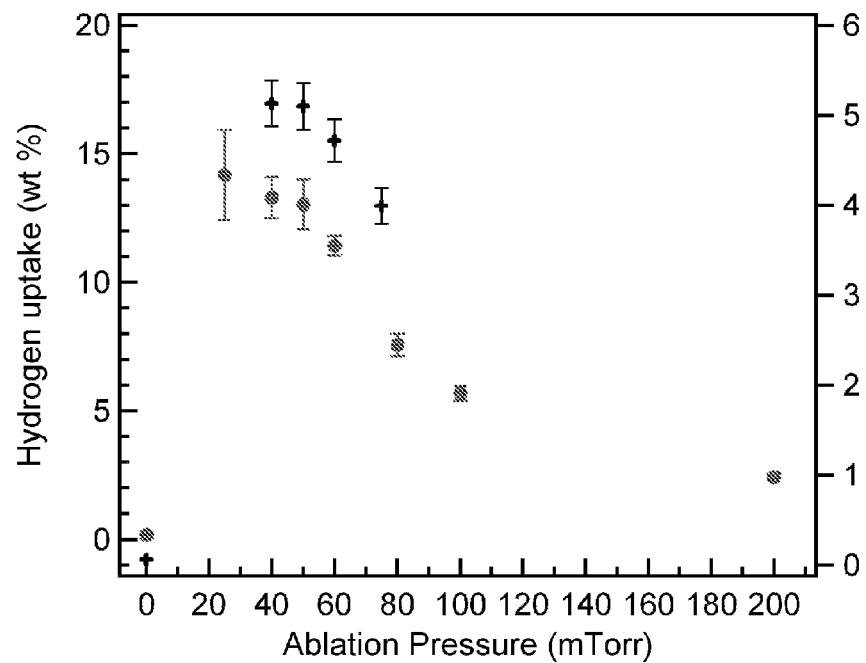
FIG. 2 graphically illustrates measured hydrogen absorption at various pi bond gas pressures. The circle data points show the hydrogen absorption of Ti-ethylene complexes created at various pressures on the left axis, and the cross data points show the hydrogen absorption of Ni-ethylene complexes created at various pressures on the right axis.

Another aspect of this invention pertains to proper control of the pressure of the carbon containing gas in the vacuum chamber. The high hydrogen sorption ability of 14% is found only over a certain range of pressures of an alkene gas as shown in FIG. 2.

Figure 13:
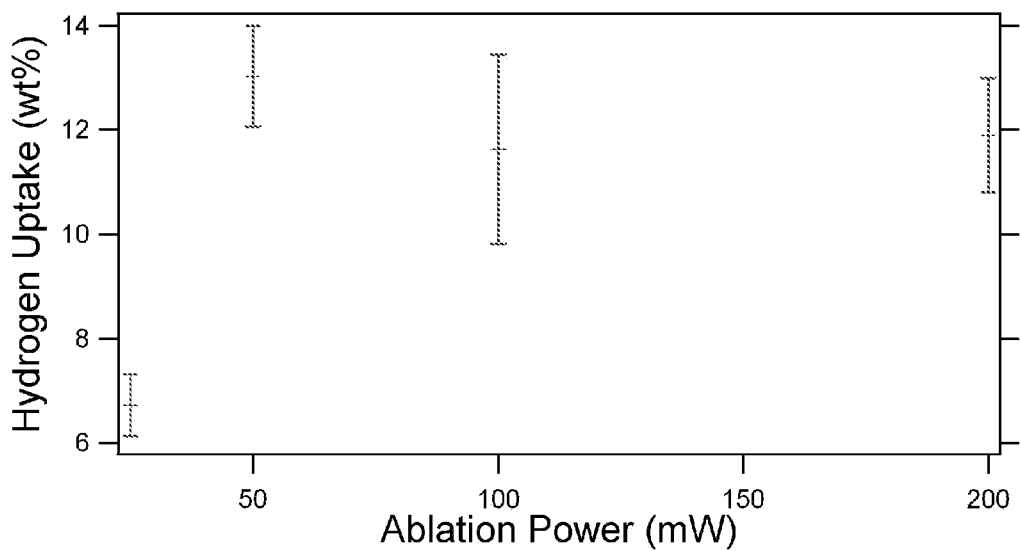
FIG. 13 graphically illustrates hydrogen absorption as a function of ablation power for situations where Titanium is ablated at various laser powers under 50 mTorr ethylene.

In the experimental apparatus that produced an aspect of an embodiment of the present invention (See FIG. 1 for experimental apparatus), the pi bond gas pressure and transition metal vaporization conditions can be changed and manipulated. As a result, control can be exercised by the inventors over the number of ethylene molecules exposed to a transition metal atom in the gas phase. The intermediate bond formed with hydrogen is a function of titanium. The inventors can "control" what titanium bonds to. By increasing the pressure, titanium can bond with more ethylene, reducing the hydrogen bond sites. Increasing laser power decreases the time to bond with ethylene, giving a high hydrogen absorption. As shown in FIG. 13, reducing power gives more time for the titanium atoms to bond with ethylene.

Figure 3:
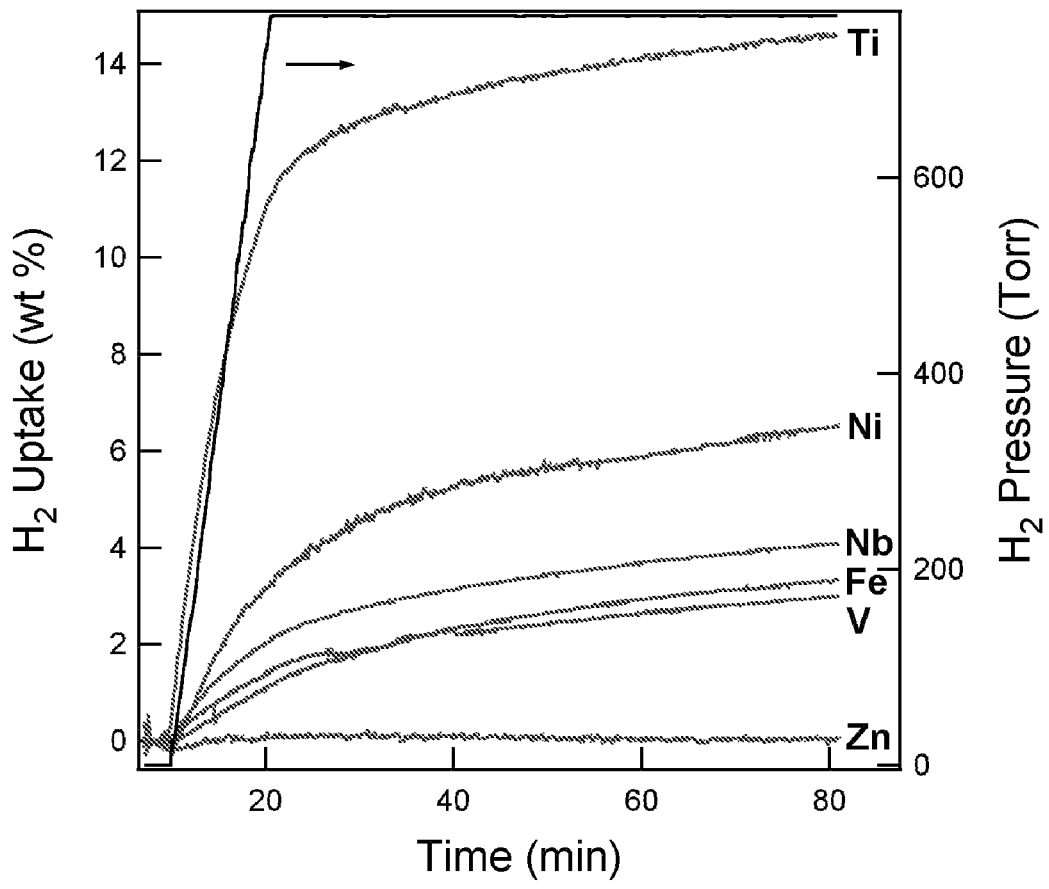
FIG. 3 graphically illustrates the measured hydrogen uptake weight percentage in selected transition metal-ethylene complexes.

An aspect of various embodiments of the present invention pertains to, but is not limited thereto, the rapid kinetics achieved, as shown in FIG. 3.

In addition, in this invention the full hydriding at about 14% level occurs at room temperature with hydrogen gas at a modest pressure (e.g. 1 atmosphere).

An aspect of various embodiments of the present invention may not start with transition metal particles. For example, an aspect of an embodiment may start with a bulk material which is ablated using a pulsed laser. The focused energy of the laser causes the target material to vaporize. This is done in an atmosphere of alkene/alkyne gas. The transition metal atoms bond with the gas to form the storage material before landing on the substrate. The substrate is also a sensor which measures the mass. After the material is made, hydrogen is introduced into the system. Further changes in the mass due to the hydrogen uptake are recorded.

Transition metal atoms bond to the pi-bonds of alkenes/alkynes through the sharing of d electrons, as does hydrogen. Additionally, because the electrons of the transition metal and hydrogen interact weakly, the bond energy is on the order of about 0.5 eV. Physisorption has bond energy of about 0.1 eV and is only accomplished at cryogenic temperatures, and chemisorption is on the order of about 2-3 eV, which means hydrogen can only be desorbed at extremely high temperatures (i.e. about 300+ deg C.). The approximately 0.5 eV bond energy associated with the presently invented material suggests that that the hydrogen will desorb from this material at a moderate temperature.

Figure 4:
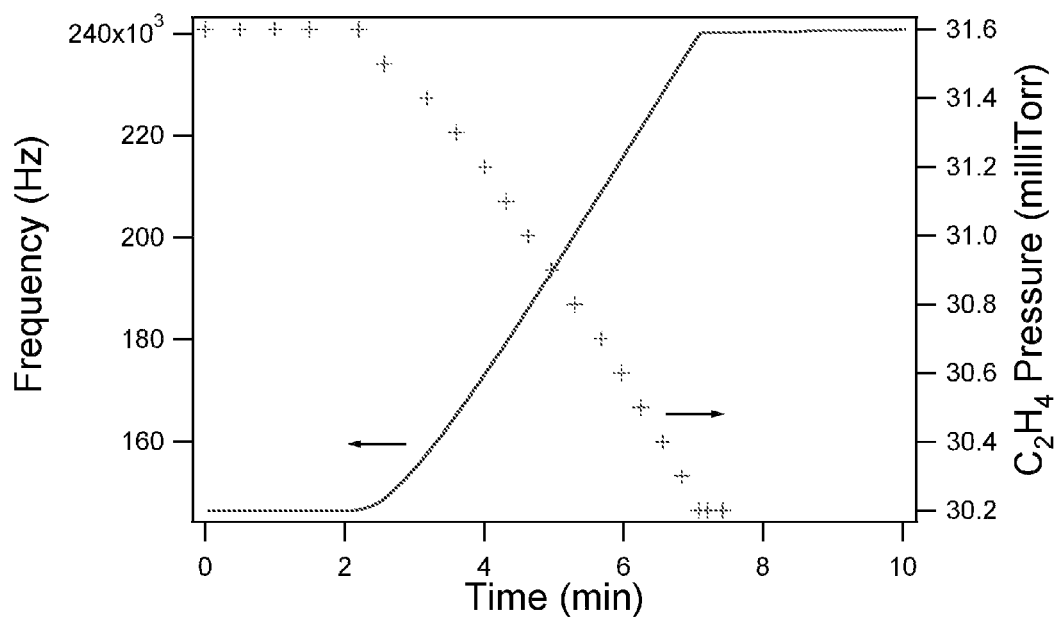
FIG. 4 graphically illustrates Titanium ablation in ethylene and the measured ethylene pressure drop. On the left axis is the SAW response as Ti is ablated in an ethylene atmosphere. The right axis shows the ethylene pressure drop during ablation.

The experimental work that produces the present invention is performed under a different set of conditions than previous experiments in the prior art that involve mixing transition metals with ethylene and other pi bond gases. In the present invention, transition metals are ablated in a UHV chamber in the presence of an initially fixed pressure ethylene or other pi bond gas (that initially fixed pressure is low compared to pressures used in prior experiments in the prior art). During ablation, the starting ethylene pressure observed decreases systematically (runs with Ti and Ni were performed to show this). FIG. 4 is a graph showing this result. The pressure decrease is indicative of the total number of molecules in the gas phase being depleted. This discovery involving the decreasing pressure is not present in the prior art.

The complexes that are generated in the vapor phase are allowed to collect on the face of the surface acoustic wave (SAW) sensor. The SAW serves as a high-resolution gravimetric sensor with the shift in the resonant frequency of the sensor being directly proportional to the mass absorbed. Ultrapure hydrogen is subsequently introduced in the chamber up to a pressure of 760 Torr, and the resulting additional mass is recorded. This procedure has been performed on a number of complexes synthesized at a variety of ethylene and other pi bond gas pressures. FIG. 2 shown above, shows the hydrogen absorption of the titanium-ethylene complexes synthesized at various ethylene ablation pressures. Also shown in this figure are results from transition metal samples ablated without ethylene but in argon, which was done to prevent damage to the SAWs. This latter result supports the conclusion that the transition metal-pi bond gas complexes are absorbing the hydrogen molecules as opposed to absorption by nascent titanium. As shown in FIG. 2, hydrogen uptake reaches a plateau near 12 wt % for ablation in a low ethylene pressure, but decreases for higher ethylene pressures. This same behavior is suggestive from the data on Ni as ablated in $C_2H_4$ at different pressures, also shown in FIG. 2.

The hydrogen storage material with intermediate bond strength, the process for making the same, and various embodiments of the invention disclosed herein may utilize aspects disclosed in the following patents and applications and are hereby incorporated by reference in their entirety:

1. U.S. Pat. No. 7,101,530 B2 to Pez et al., "Hydrogen storage by reversible hydrogenation of pi-conjugated substrates," Sep. 5, 2006.

2. U.S. Pat. No. 7,250,146 B2 to Yun Hang Hu et al., "Method for producing a reversible hydrogen storage medium with high storage capacity and ultrafast kinetics," Jul. 31, 2007.

3. U.S. Pat. No. 7,329,399 B2 to Camaro et al., "Hydrogen Trapper Compound, Method for the production and uses thereof," Feb. 12, 2008.

4. U.S. Pat. No. 7,250,386 B2 to Ovshinsky, "Quantum limit catalysts and hydrogen storage materials," Jul. 31, 2007.

5. U.S. Pat. No. 7,108,757 B2 to Baoquan, "Hydrogen storage alloys providing for the reversible storage of hydrogen at low temperatures," Sep. 19, 2006.

6. U.S. Pat. No. 7,029,600 B2 to Ovshinsky et al., "High capacity hydrogen storage material based on catalyzed alanates," Apr. 18, 2006.

7. U.S. Pat. No. 6,875,536 B2 to Ovshinsky, "Catalytic hydrogen storage composite material and fuel cell employing the same," Apr. 5, 2008.

8. U.S. Pat. No. 6,830,725 B2 to Fetcenko et al., "Hydrogen storage alloys having a high porosity surface layer," Dec. 14, 2004.

9. U.S. Pat. No. 6,746,645 B2 to Ovshinsky et al., "High storage capacity, fast kinetics, long cycle-life, hydrogen storage alloys," Jun. 8, 2004.

10. U.S. Pat. No. 6,726,783 B1 to Young, et al., "High storage capacity alloys having excellent kinetics and a long cycle life," Apr. 27, 2004.

11. U.S. Pat. No. 6,328,821 B1 to Ovshinsky et al., "Modified magnesium based hydrogen storage alloys," Dec. 11, 2001.

12. U.S. Pat. No. 7,175,826 B2 to Lemmon, et al., "Compositions and methods for hydrogen storage and recovery," Feb. 13, 2007.

13. U.S. Pat. No. 7,166,150 B2 to Torgersen et al., "Scaffolded borazane-lithium hydride hydrogen storage materials," Jan. 23, 2007.

14. U.S. Pat. No. 7,118,611 B2 to Snow et al., "Nanoparticle mixtures for hydrogen storage, transportation, and distribution," Oct. 10, 2006.

15. U.S. Pat. No. 6,306,339 B1 to Kiyokawa et al., "Method for manufacturing hydrogen storage material," Oct. 23, 2001.

16. U.S. Patent Application Publication No. US2008/020248 A1 to Sridhar et al., "Hydrocarbon gas carbon nanotube storage media," Jan. 24, 2008.

17. U.S. Patent Application Publication No. US2007/0092395 A1 to Rijssenbeek et al., "Hydrogen storage material and method for making," Apr. 26, 2007.

18. U.S. Patent Application Publication No. US2006/0292065 A1 to Wolverton et al., "High density hydrogen storage material," Dec. 28, 2006.

EXAMPLES AND EXPERIMENTAL RESULTS

Practice of the invention will be still more fully understood from the following examples and experimental results, which are presented herein for illustration only and should not be construed as limiting the invention in any way.

Experiment No. 1

Transition Metal-Ethylene Experiments

In this section results are presented of a transition metal-ethylene complex study where the complexes were formed in an ultra high vacuum pulsed laser deposition (PLD) chamber, were collected on quartz surface acoustic wave sensors for mass analysis, and were subsequently exposed to high purity hydrogen gas. The PLD system is of standard design and consists of a frequency double pulsed Nd:YAG laser that operated at 10 Hz, and where fluence equaled 1.6-65 $J/cm^2$. The laser was used to ablate a rotating metal target in an ethylene atmosphere.

The technique used for the mass analysis of hydrogen absorbed in these experiments was unique. The technique is based on the application of a frequency modulation technique to identify unambiguously the resonant frequency on a surface acoustic wave resonator (SAWR) to better than 0.1 ppm. A downward shift in the resonant frequency, either due to the initial deposition of the complex or due to the absorption of hydrogen gas, indicates a mass accumulation on the resonator face. This shift can be measured with a 0.1 ppm resolution, and in the present invention's case, this translates to a mass change of 4 picograms. The inventors arrived at this result through a separate calibration of the SAW sensor with the method described by the inventors in the following article: A. B. Phillips and B. S. Shivaram, Appl. Phys. Lett., 91, 153109 (2007), of which is hereby incorporated by reference herein.

This level of specificity in the measurements is crucial in the context of hydrogen absorption measurements with nanograms of material. In the experimental apparatus that produced an aspect of an embodiment of the present invention, the ethylene pressure and laser power can be changed. As a result, control can be exercised over the number of ethylene molecules exposed to a transition metal atom in the gas phase. Thus, control can also be exercised over the bond formations.

FIG. 3 is a graphical illustration of the percentage mass increase measured on a number of TM-ethylene complexes as $H_2$ is introduced subsequent to their growth. The right vertical axis shows the hydrogen gas pressure. These complexes were grown with a starting ethylene pressure in the PLD chamber of 13 Pa or less (i.e. the ethylene pressure during ablation was below 13 Pa in all cases). A surface acoustic wave device operating at 315 MHz is used as a gravimetric sensor to measure the mass increase due to $H_2$ uptake by the TM-ethylene complexes formed in a PLD chamber.

Although there have been several previous growth experiments where TM targets have been ablated with a Nd:YAG laser the recipes followed are quite at variance from ours. (17) FIG. 3 also illustrates the kinetics of the $H_2$ absorption process. The kinetics is quite rapid and comparable to that shown by the leading materials being considered for storage today. (18)

Figure 5:
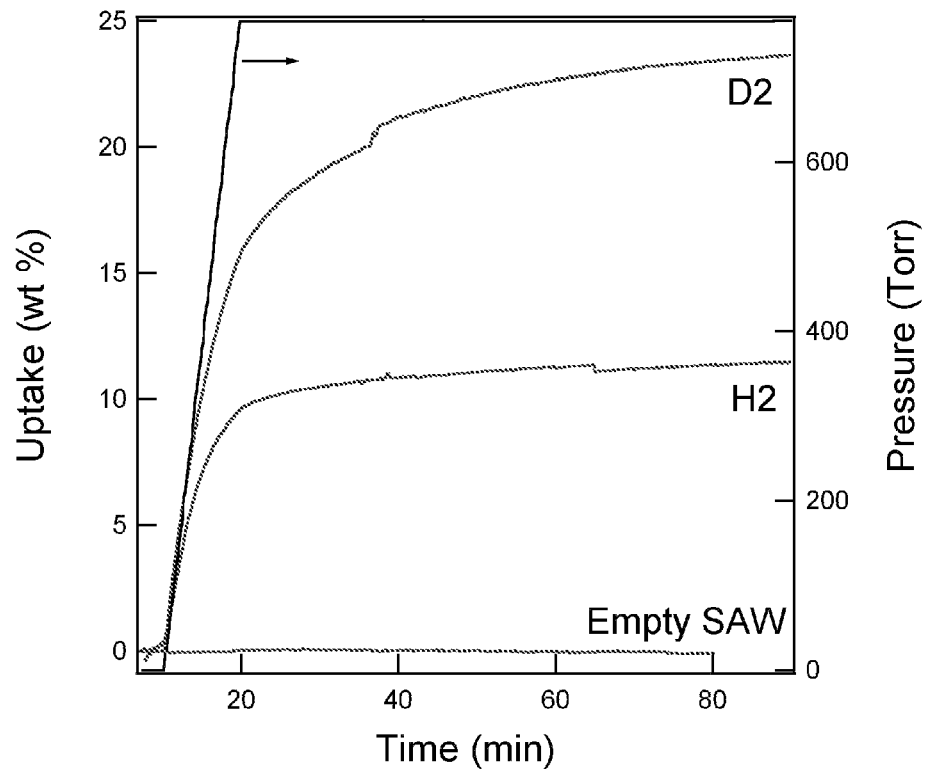
FIG. 5 graphically illustrates a comparison of the measured $H_2$ and $D_2$ (deuterium) absorption in the Ti-Ethylene complex, indicating a doubling of absorption in $D_2$.

To verify that it is indeed hydrogen that we are absorbing into the complexes formed we have performed several tests. In FIG. 5 results obtained on a titanium-ethylene complex under both $H_2$ and $D_2$ exposure are shown. This expected near doubling of the gravimetric percentage observed is a direct confirmation of hydrogen uptake by the Ti-ethylene complex. The complex was synthesized in 6.5 Pa of ethylene. Also shown in FIG. 5 is the response of an empty SAWR when exposed to $D_2$ (with exposure to $H_2$ being similar). Furthermore, during ablation of the metal, a systematic reduction in ethylene pressure in the chamber occurs. This is in contrast to hydrogen elimination (or activation) reactions where one would expect an increase in pressure. As a final verification that a Ti-ethylene complex is involved in the large $H_2$ uptake, Ti was ablated under pure Ar (no ethylene) and observed no significant hydrogen uptake under the same hydrogen loading conditions.

Figure 6:
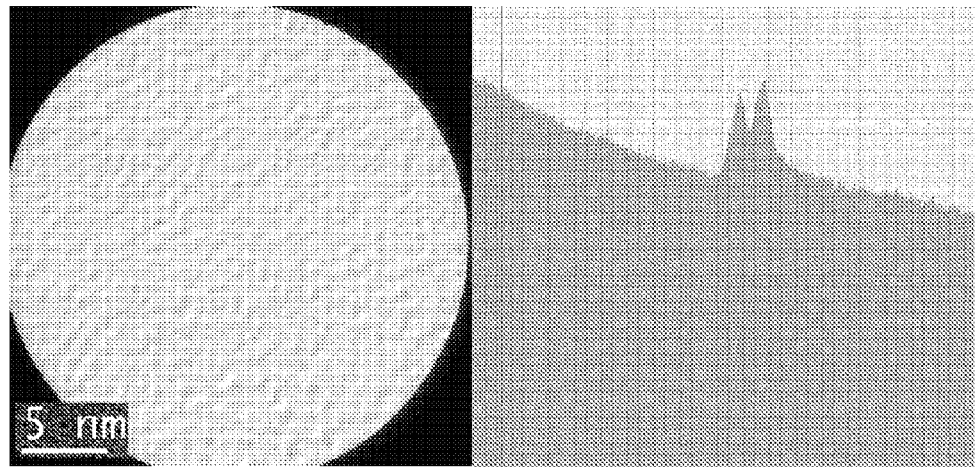
FIG. 6(A) provides a micrographic depiction of a high resolution transmission electron microscopy image of titanium complex collected on a T.E.M. grid, after ablation in 6.5 Pa ethylene for 5,000 pulses FIG. 6(B) provides the corresponding electron energy loss spectrum.

To characterize the TM-complexes in the condensed phase we have performed high resolution transmission electron microscopy (TEM) measurements on samples collected on carbon grids placed next to the SAW resonators. FIG. 6(A) shows a TEM picture of a sample obtained by ablating titanium in ethylene at 6.5 Pa for 5,000 pulses, as well as the corresponding electron energy loss spectrum (EELS), as shown in FIG. 6(B). The TEM picture reveals no significant structure on the surface down to a scale of 1 nm, but the EELS scan shows two peaks that correspond to titanium thus suggesting that the titanium-ethylene complex is uniformly deposited through the PLD method.

Figure 7:
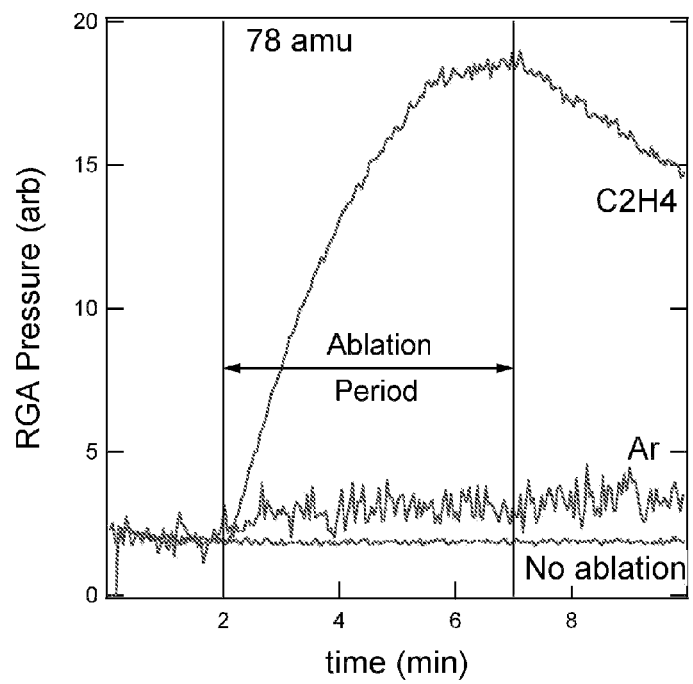
FIG. 7 graphically illustrates the increase in the partial pressure (in arbitrary units) of the 78 AMU species that is unique to experimental runs when Ti is ablated in ethylene, as measured by a residual gas analyzer (RGA). The two vertical lines mark the beginning and end of the ablation process. In the set-up, the RGA is positioned at an angle of 15 deg. behind the plane of the target with the position of the RGA filament being 50 cm away from the ablation region.

To characterize the TM-ethylene complexes formed in the vapor phase the inventors have performed mass spectroscopic analysis in the gas phase during ablation of the TM under various conditions. This analysis, performed using a Transpector XPR-3 residual gas analyzer (INFICON), was carried out in ethylene and argon pressures of 1.4 Pa as well as under vacuum. We find definitive formation of a new species, with a mass of 78 amu which very likely is the precursor to the functional Ti-ethylene complex necessary for high $H_2$ absorption. The measurements with the RGA are exhibited in FIG. 7. FIG. 7 shows the increase in the partial pressure (in arbitrary units) of the 78 AMU species that is unique to experimental runs when Ti is ablated in ethylene. The results for ablation of Ti in vacuum are similar to the case of no ablation. The two vertical lines mark the beginning and end of the ablation process.

Figure 8:
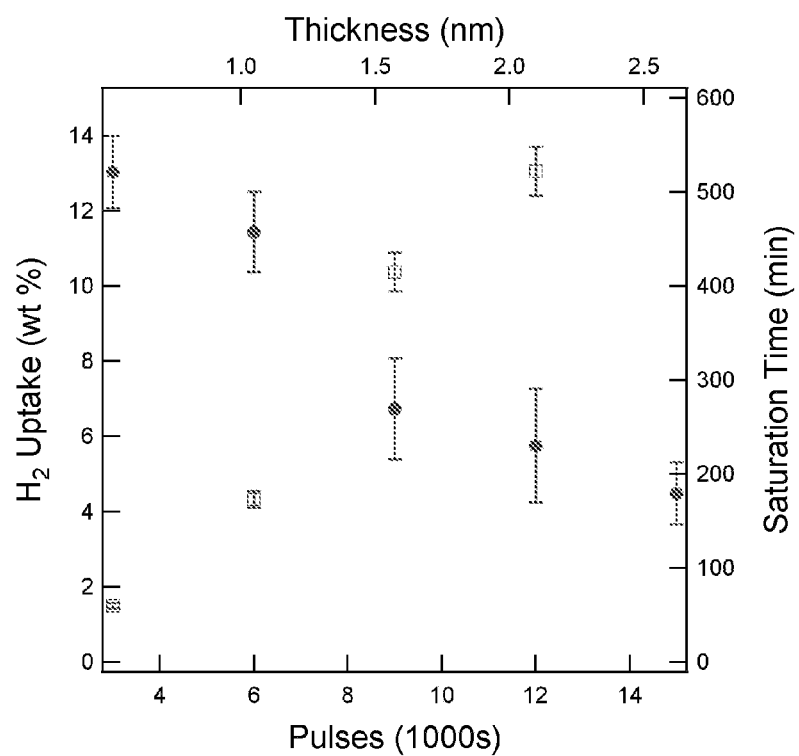
FIG. 8 graphically illustrates hydrogen uptake and weight percentage as a function of the total quantity of the Ti-ethylene complex accumulated on the transducer face. The data is presented in two different ways. The top vertical axis measures the thickness of the film calculated using the lattice spacing of titanium carbide and the bottom axis is the total number of laser pulses used to accumulate the material. The left vertical axis (circles) presents the uptake that occurs in 1 hour and the right vertical axis (squares) the total time it takes to reach "full" saturation of 12%.

To explore issues with metal atom clustering as predicted by some theorists, the inventors investigated hydrogen uptake for varying thickness of the accumulated complex. FIG. 8 shows hydrogen uptake and weight percentage as a function of the total quantity of the Ti-ethylene complex accumulated on the transducer face. The data is presented in two different ways. The top vertical axis measures the thickness of the film calculated using the lattice spacing of titanium carbide and the bottom axis is the total number of laser pulses used to accumulate the material. The left vertical axis (circles) presents the uptake that occurs in 1 hour and the right vertical axis (squares) the total time it takes to reach "full" saturation of 12%. The same amount of the complex when allowed to stay under the final pressure of 760 Torr $H_2$ reaches the full 12 wt % uptake eventually and this time to "saturation" is shown on the right axis. These results appear to suggest that the TM atoms do not cluster in the complexes formed in our experiments for thicknesses up to a few nanometers.

It is possible to convert the percentage uptake measurements of hydrogen absorption in all the transition metal-ethylene complexes we studied to the number of $H_2$ molecules adsorbed per TM atom if we make the assumption that all of the deposited mass on the SAWR is the TM-$C_2H_4$ complex. The uptake fraction, r, defined by $r=m_H/(m_H+m_{complex})$ where $m_H$ and $m_{complex}$ are proportional to the experimentally obtained relative frequency shifts, is related to the number of $H_2$ molecules x, through the formula, $x=[r(m_{TM}+m_{C_2H_4})]/[(1-r)m_{H_2}]$. These results are shown in Table 3. More specifically, Table 3 shows the experimental results of the number of $H_2$ molecules absorbed per transition metal atom. The error bars in the experimental numbers arise from the precision with which we can measure the fraction r. Of note is the behavior of Zinc (Zn) which, in contrast to the other lighter TM, exhibited no hydrogen uptake as measured through the SAWs and exhibited no decrease in ethylene pressure on ablation.

TABLE 3

| | Element | | | | | |
|---|---|---|---|---|---|---|
| | Nb | V | Fe | Zn | Ti | Ni |
| Experiment | 2 ± 0.3 | 1 ± 0.3 | 2.0 ± 0.3 | 0 | 5 ± 0.4 | 2 ± 0.3 |

In conclusion we have observed transition metal-ethylene complexes with high hydrogen absorption capacity at room temperature formed by pulsed laser deposition techniques. These complexes have excellent absorption kinetics initially but with continued accumulation require enhanced times to complete the high absorption process. With deuterium replacing hydrogen we obtain the expected near doubling of the mass absorbed. We have characterized the complexes formed through PLD with high-resolution TEM measurements and find that our samples are homogenous with Ti distributed uniformly on the nanometer scale. Additionally, we have performed mass spectroscopic measurements during the laser ablation process and find large quantities of a new species with mass=78 amu in the gas phase. This species is the likely precursor for the high $H_2$ absorbing Ti-ethylene complexes that are formed on the SAWR.

Figure 9:
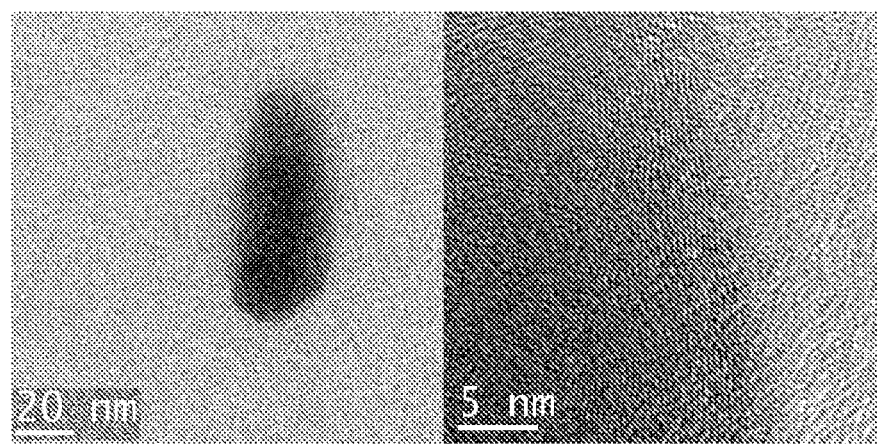
FIGS. 9(A)-(B) is a micrographic depiction, at 10,000× and 50,000× magnifications, respectfully, of the titanium-ethylene complex collected on a T.E.M. grid after the titanium is ablated in 100 mTorr ethylene.
Figure 10:
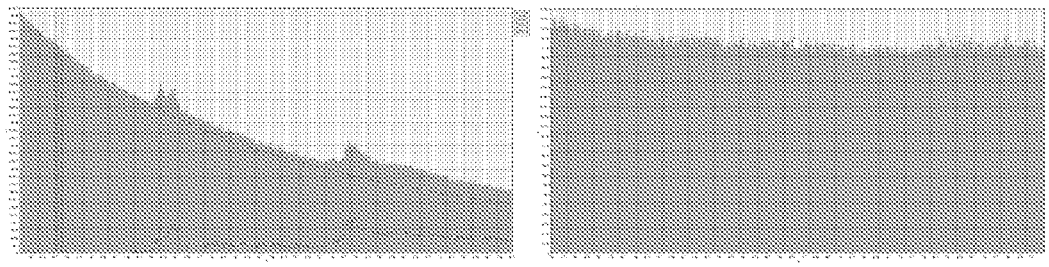
FIG. 10 schematically illustrates the EELS spectra when the particle of FIG. 9 is in the aperture, FIG. 10(A), and not in the aperture FIG. 10(B).

It is useful to view these results in the context of the discussion that has occurred in the theoretical literature. The encouraging prediction of the possibility of high $H_2$ absorbing complexes formed from $T_1$-$C_2H_4$ has been countered by concerns that polymerization of such metal carbon complexes could occur and degrade the possibility of high $H_2$ absorption. These arguments motivated us to perform transmission electron microscopy studies (TEM) on samples at various ethylene pressures that were collected concurrent to the SAW measurements. The TEM samples were collected on commercial carbon grids placed next to the SAWs. A high-resolution TEM with energy electron-loss spectroscopy (EELS) capability was used to inspect the samples. In FIGS. 9(A)-(B) we show the TEM image of a sample created under a higher ablation pressure (100 mTorr ethylene) at both 10,000× and 50,000× magnification, respectfully. The particle shown is one of many on this sample. FIG. 10 illustrates EELS spectra. EELS measurements on such samples show that the titanium peaks are observed only when these nanoparticle structures are in the aperture window, FIG. 10(A), and not in the aperture FIG. 10(B). Regions outside the particle do not yield signatures of the metal being ablated.

Figure 11:
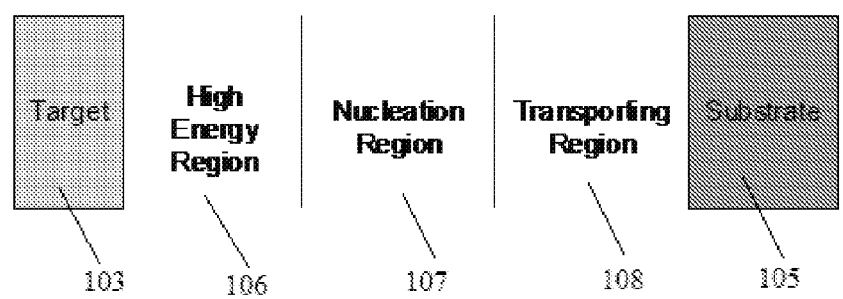

The formation of nanoparticles itself when ablation is carried out in a background gas is a well established phenomena and can be understood qualitatively based on a model proposed by Fu. (19) In this model there are three regions, labeled High Energy region, Nucleating region and transporting region as shown in FIG. 11, which is a schematic illustration of a kinetic diagram for PLD ablation showing the three regions between the target 103 and the substrate 105 where the ejected atom can pass through. In the high energy region 106 the atoms/molecules from the ablated target have a high enough kinetic energy that collisions do not result in any particle formation. In the nucleation region 107 the ablated species have cooled down sufficiently so that nanoparticles are formed. The transport region 108 is where the complex proceeds towards the substrate 105 for collection without further bonding.

Figure 12:
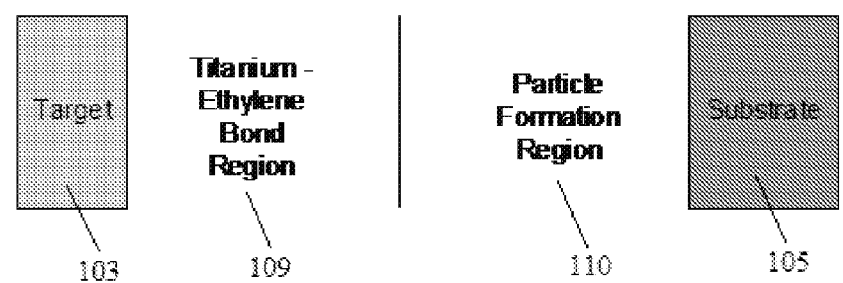
FIG. 12 schematically illustrates a kinetic diagram for PLD ablations of titanium in ethylene showing the two regions between the target and the substrate.

Our results can be considered in the context of this model with the addition that the metal atoms can bond with the background gas. Consequently, there is a first region close to the target where a titanium-ethylene complex is formed. Such metal-precursor molecules can come together in a second region if their kinetic energies are sufficiently lowered to form nanoparticles. FIG. 12 is a schematic illustration of a kinetic diagram for PLD ablations of titanium in ethylene where the two regions between the target and substrate are shown: Titanium Ethylene Bond Region 109 and Particle Formation Region 110. The results shown in FIG. 13 were produced by ablating Titanium at various laser powers under 50 mTorr ethylene. In the first region, titanium atoms ejected from the target bond with ethylene. Within such nanoparticles it is possible that polymerization of the metal-ethylene complex occurs because all of the titanium atoms have bonded to ethylene in the first zone, and only collisions with additional titanium-ethylene will result in additional agglomeration to form the nanoparticle.

The physical size of the bonding and the agglomeration regions compared to the target—substrate distance is expected to depend on the precursor pressure. If there were a third nonbonding high-energy region low-pressure ablations would result in a mixture of titanium-ethylene and pure titanium deposited on the SAWs. Holding the pressure constant and varying the power should expand this region. The results of our attempts to search for this region are shown in FIG. 13. At the highest ablation powers used we do not observe a decrease in the hydrogen absorption at low pressure. We therefore conclude that there must not be a nonbonding region. At low pressure the bonding region most likely encompasses the entire distance between the target and the substrate in our apparatus. For the power and spot size used in this investigation, ablation pressure of 50 mTorr and lower result in only the bonding region. The hydrogen absorption systematically lowers with higher ablation pressure.

This kinetic energy diagram can also be understood in terms of bonding collisions. The first zone, the bonding region 109 as shown in FIG. 12, is where one or two bonding collisions between the titanium and ethylene result in a material with the highest hydrogen uptake. Subsequent bonding collisions result in the particle formation, 110, which systematically reduces the hydrogen uptake. At some point the particles will be unable to absorb hydrogen due to a lack of bonding sites for the hydrogen. The number of collisions for no hydrogen uptake is expected to be near 100. The lower number of bonding collisions then the higher the hydrogen uptake will be. As the number of bonding collisions approaches 100 then hydrogen uptake decreases. A low number of bonding collisions can be considered to be the number that permits hydrogen to absorb. A first tier may be in the range of about 1-2 collisions. A second tier or range may be about 3-10 collisions. Further, another range may be about 11-30 collisions. Still yet, another range may be about 31-50 collisions. Moreover, another range may be about 51-100 collisions or any level(s) therein. The first tier would produce the material with the highest hydrogen uptake. The hydrogen uptake will decrease as the number of collisions in the given tiers or ranges increase. Even the tier with the most collisions still produces a material with a positive hydrogen uptake, which is heretofore not realized before in the prior art. The invention covers any material involving—formed by any number of collisions—that leads to a positive hydrogen uptake.

All of the results presented above can be understood qualitatively based on the proposed structures for TM-ethylene complexes. For all the structures, each titanium atom can bond to multiple hydrogen molecules, and the sandwich structure can hold the most with a maximum of five. With two titanium atoms per ethylene molecule, this leads to 14 wt % hydrogen absorption. Titanium, though, can bond with other titanium to form a polymer. Bonding with other Ti atoms reduces the number of sites for the hydrogen to bond, and, thus, lowers the absorption. Ti atoms could also bond to addition ethylene molecules, which would also result in lower hydrogen absorption.

Figure 14:
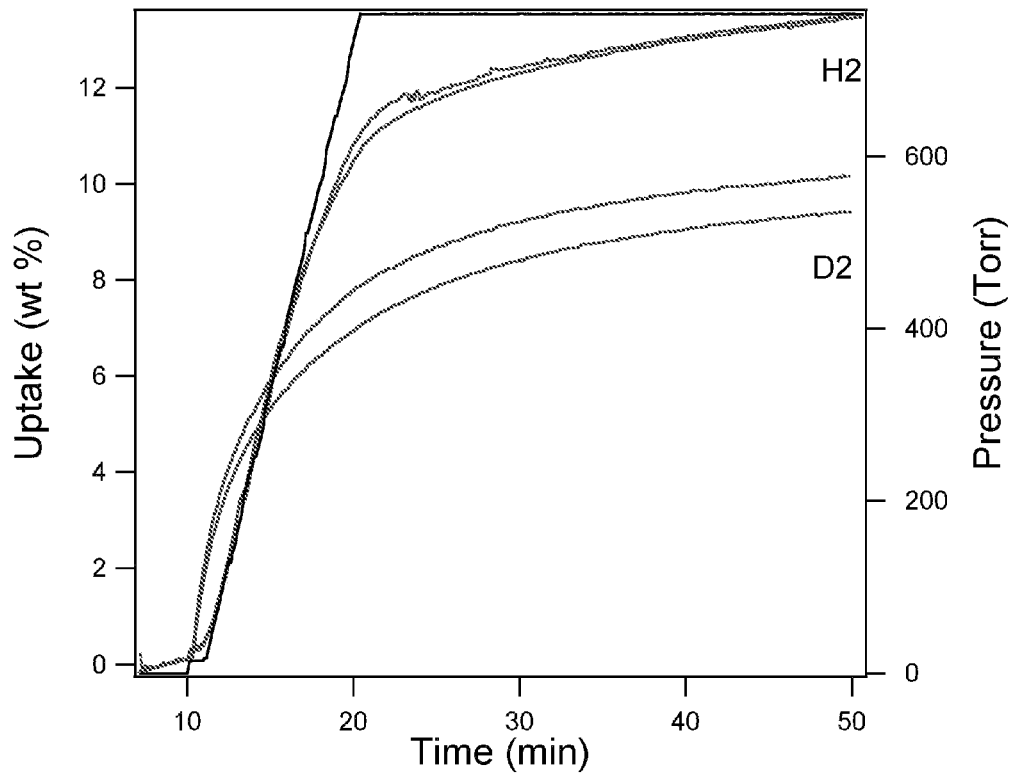
FIG. 14 graphically illustrates the hydrogen uptake of the titanium-ethylene complex followed by subsequent deuterium replacement. The titanium-ethylene complex is created following the normal procedure and hydrogen loaded (H2 results). The hydrogen is then evacuated from the chamber followed by the introduction of deuterium (D2 results).

One Department of Energy (DoE) requirement, in addition to the high hydrogen uptake and fast kinetics demonstrated above, is moderate desorption temperature. The inventors performed an experiment intended to determine whether the hydrogen storage material will desorb hydrogen at a moderate temperature. The purpose of the experiment was to analyze the bonds between the hydrogen and titanium. The results of the experiment reaffirm that a necessary low bonding energy is involved. The hydrogen storage materials were created as described above and loaded with hydrogen. Once the samples were saturated, the hydrogen was evacuated from the chamber and deuterium (i.e. hydrogen with a neutron, or "heavy hydrogen") was introduced into the chamber. The increase in mass due to deuterium is only possible if it displaces hydrogen, so the results show that deuterium does replace some of the hydrogen bound to the titanium-ethylene complex. The results of this experiment are shown in FIG. 14. The mass increase due to deuterium is nearly 70% of that due to the initial hydrogen loading. Because deuterium has a lower bonding energy than hydrogen, it is expected that molecular hydrogen will be replaced by molecular deuterium while atomic hydrogen will remain bound to the material. The results of this experiment show that several hydrogens are bound to the titanium-ethylene complex are in molecular form, and, thus, consist of the intermediate bond energy needed for moderate temperature desorption.

Figure 15:
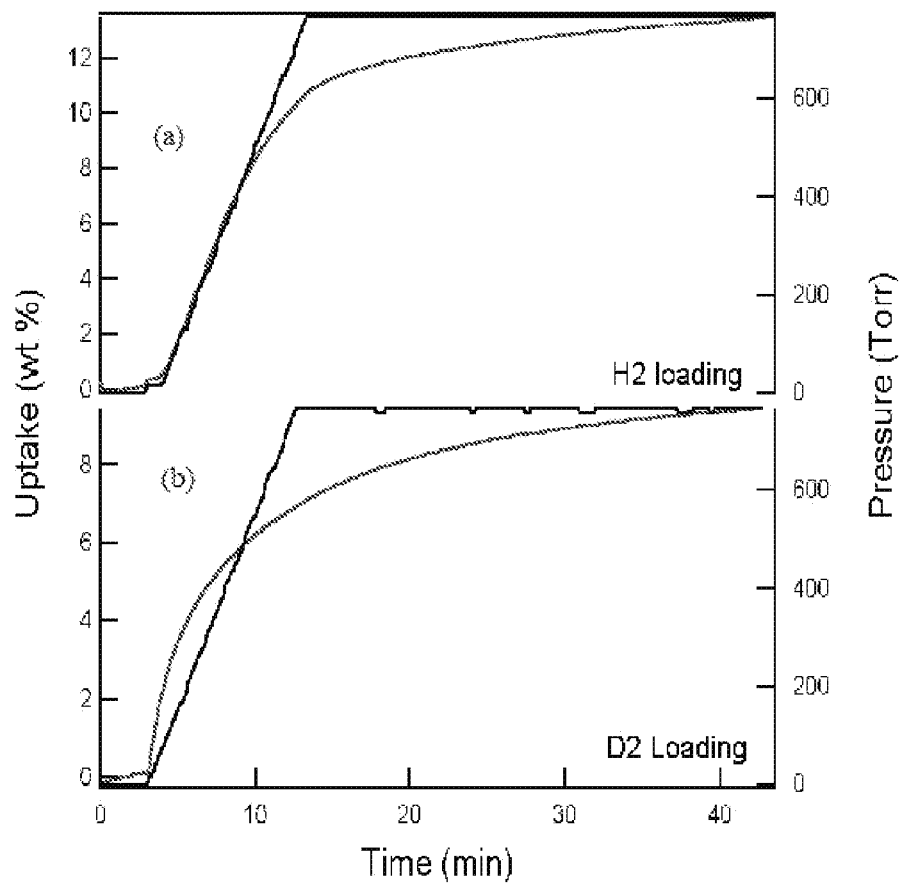
FIG. 15 graphically illustrates the hydrogen uptake in a Ti-ethylene complex at room temperature, as well as the situation where hydrogen pressure is decreased by pumping out the hydrogen and replacing it with deuterium.

FIG. 15(A) graphically illustrates the hydrogen uptake in a Ti-ethylene complex at room temperature. The percentage uptake observed is greater than 12%. On this same sample when the hydrogen pressure is decreased by pumping out the hydrogen and replacing it with deuterium a further mass increase of 9% is observed. This indicates that part of the hydrogen that was imbedded in the sample is being replaced by the heavier deuterium.

Figure 16:
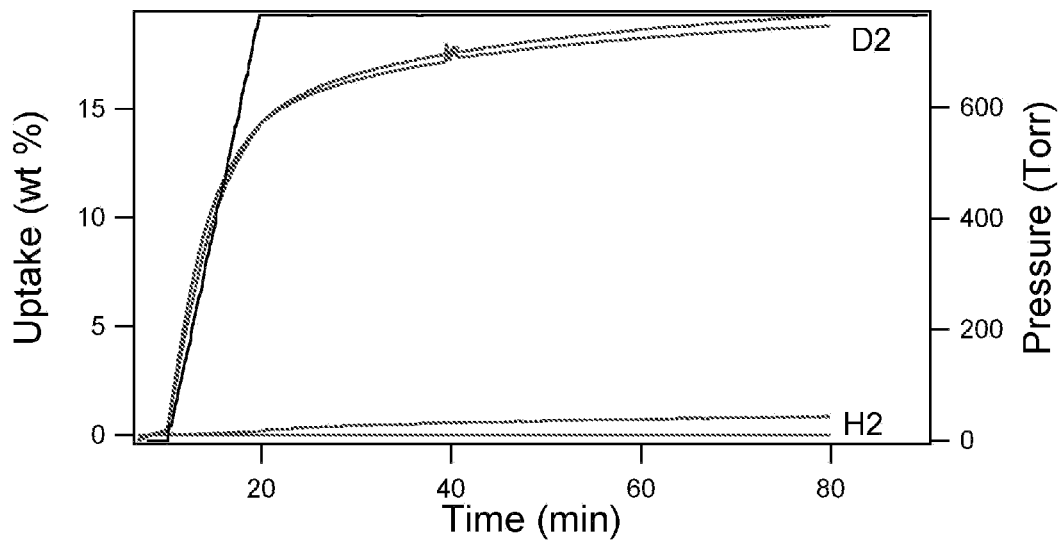
FIG. 16 graphically illustrates the results when the hydrogen storage material is first loaded with D2, and then H2 is subsequently introduced.

FIG. 16 shows that if the opposite process is performed, that is if the hydrogen storage material is first loaded with D2 and then H2 is subsequently introduced, no further change is observed in the mass that is absorbed.

Figure 17:
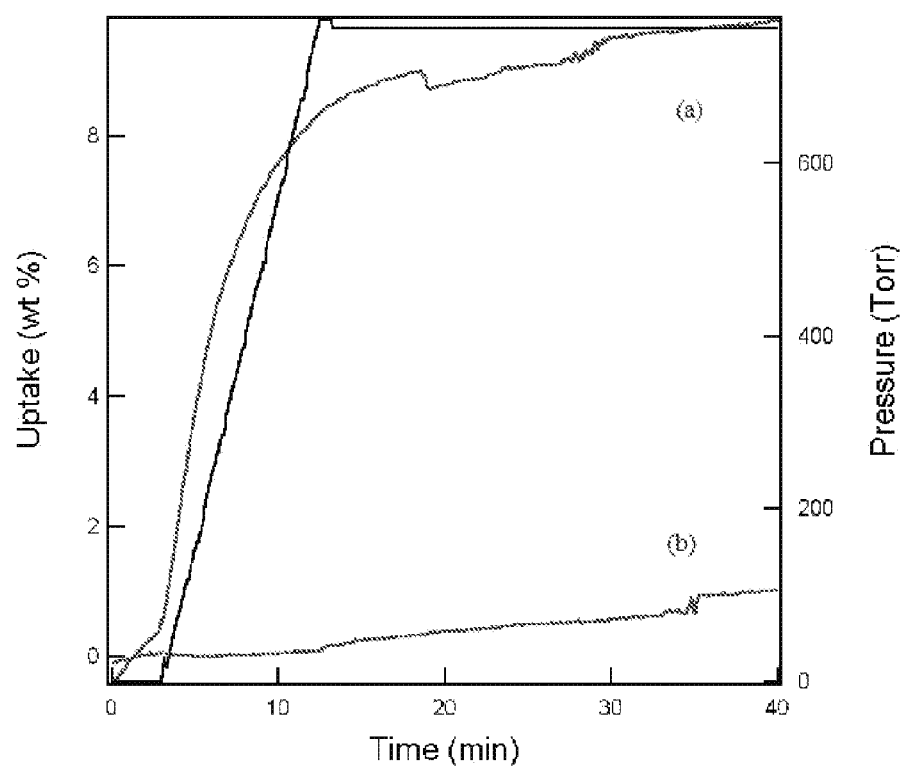
FIG. 17 graphically illustrates the results when the hydrogen storage material is loaded with hydrogen (FIG. 17(A)), then the hydrogen is later pumped out, then the hydrogen is subsequently reintroduced (FIG. 17(B)).

FIG. 17 graphically illustrates the results when the hydrogen storage material is loaded with hydrogen (FIG. 17(A)), then the hydrogen is later pumped out, then the hydrogen is subsequently reintroduced (FIG. 17(B)). The second time the hydrogen is introduced (FIG. 17(B)) there is a negligible increase in uptake.

Experiment No. 2

Titanium-Benzene Experiments

Using largely the same process and laboratory setup outlined in Experiment 1 above (used to create the transition metal-ethylene materials), the inventors also created a titanium-benzene hydrogen absorption material. And like the transition metal-ethylene materials, the titanium-benzene material exhibited a positive hydrogen absorption value at modest temperatures and pressures. Furthermore, like the transition metal-ethylene complexes, when generated in the most optimal conditions (conditions where the fewest bonding collisions occur), the titanium-benzene hydrogen storage material has a hydrogen uptake value nearly identical to what is theoretically predicted. (20)

Figure 18:
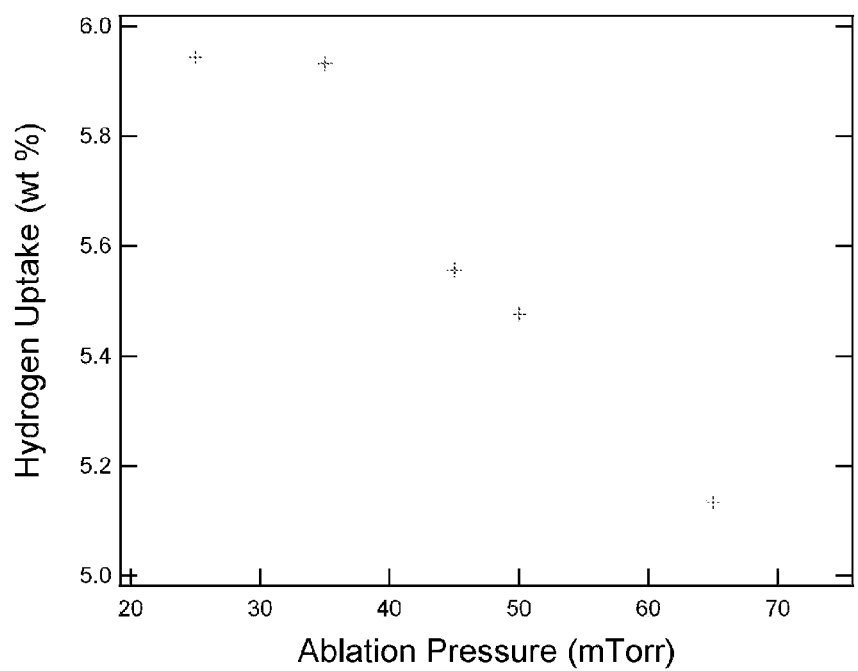
FIG. 18 graphically illustrates measured hydrogen absorption of the titanium-benzene complex at various pressures.

FIG. 18 shown above, shows the hydrogen absorption of the titanium-benzene complex synthesized at various benzene ablation pressures. As shown in FIG. 18, hydrogen uptake reaches a plateau near 5.9 wt % for ablation in a low benzene pressure (where fewer bonding collusions occur in the formation of the material), but decreases for higher benzene pressures (as the number of bonding collisions occurring in the formation of the material increases).

Experiment No. 3

Methane Experiments

The inventors also proved that mixing a transition metal in methane under numerous conditions does not produce a material that has a positive hydrogen uptake value. In fact, the methane pressure was found not to decrease during ablations, as was the case in ethylene and benzene, suggesting no titanium-methane complex was formed. Since methane is not a pi-bond gas, this discovery by the inventors further supports the notion that a pi-bond gas is a necessary element of the invention.

Example No. 1

Laboratory and Experimental Equipment Arrangement

The most commonly used technique for measuring hydrogen absorption is the volumetric (Sieverts) method. A significant requisite to employ this method is that the sample mass must be on the order of grams. For many of the new nanostructured materials of interest, in the context of hydrogen storage, due to limitations in fabrication methods this requirement often cannot be satisfied. Thermal desorption techniques are also commonly used to measure hydrogen desorption. In these cases, the samples are placed under vacuum and heated to release the hydrogen and a residual gas analyzer measures the concentration of released hydrogen. This method also requires at least milligrams of material be available. In contrast, gravimetric methods can be adopted to measure hydrogen sorption in smaller quantities. A microbalance placed inside a pressure cell with an inert reference as the counterbalance to the sample can be used and the hydrogen absorbed detected by a difference signal. The microbalance mass limit is also on the order of a milligram. For samples less than a milligram, as in thin films, quartz microbalances have been used to measure hydrogen storage. (21) With quartz microbalances monolayer resolution can be achieved. (22) Due to advances in micromachining silicon cantilevers are readily available today and have been utilized for hydrogen absorption measurements in carbon nanotubes. (23) Cantilevers operated in vacuum have measured $10^{-15}$ gram change and those operated in air (1 atmosphere) can measure $10^{-13}$ gram. Of the common hydrogen sorption measurement techniques, only the cantilever approach can measure samples on the scale of nanograms, but a mechanism is needed to load the sample onto the cantilever.

The quartz crystal microbalance, on the other hand, with suitable improvements can be adopted to measure hydrogen mass loading in nanograms of a material. With the quartz crystal operated in thickness shear mode (TSM), the sensitivity can be enhanced by reducing the thickness of the quartz plate. For example, increasing the sensitivity by an order of magnitude compared to the "regular" quartz TSM monitor commonly employed in thin film deposition apparatus implies decreasing the thickness by an equivalent amount. This would make the device fragile and difficult to handle. (24) A different electrode configuration does result in higher frequency and, therefore, sensitivity without affecting the integrity of the crystal. A surface acoustic wave device (SAW) has electrodes on one surface that confine the energy to the surface of the crystal. Since the wave is confined to the surface, the SAW is extremely sensitive to surface perturbations. (25) The present paper discusses the use of such devices for performing absorption studies on isolated nanostructures deposited on the face of the device.

Figure 19:
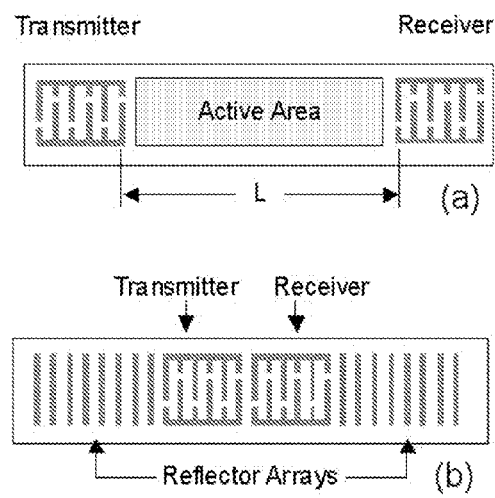
FIG. 19(A) schematically illustrates the configuration of a SAW Delay Line, and FIG. 19(B) schematically illustrates the configuration of a SAW Resonator.

There are two configurations of SAW devices that are readily available commercially, the delay line and the resonator. Each has benefits and drawbacks. Surface acoustic wave delay lines (SAWDLs) are configured such that velocity is derived from time-of-flight measurement. (26) FIG. 19(a) shows the configuration of a SAWDL. With an active area of length L, $$L=N\lambda \quad (1)$$

where N is an integer, and λ is the acoustic wavelength. Equation 1 illustrates that an integer number of wavelengths traverse the active area. The bandwidth of the device is controlled during manufacturing and is defined by the length of the interdigital transducers (IDT). Since the energy from the IDT travels in both directions, half of the energy is lost with the SAWDL resulting in a lower Q. However, the SAWDL has a large open active area with uniform energy density on which to deposit the requisite material for study. The response of this material is measured by the change in wave velocity and attenuation of the SAW.

Unlike delay lines where the surface wave travels from one set of IDT to the other, surface acoustic wave resonators (SAWRs) are configured to form a standing wave. FIG. 19(b) shows the configuration of a SAWR. Here, the transmitter creates a standing wave that the receiver samples. The reflector arrays create the resonant cavity. The entire SAW is the active area for deposition. The IDT of SAWRs are placed in the center of the crystal with reflectors on both sides to yield a higher Q device. Additionally, the reflector array determines the bandwidth, with more reflectors implying less frequency spread. SAWRs also give better signal-to-noise ratio than SAWDLs. The drawback of SAWRs, though, is that there is no isolated active area. We employed both these types of devices in the work reported here.

A SAW device responds to several surface perturbations. Changes in the mass, modulus, dielectric constant and conductivity of an adsorbed film or a collection of nanoparticles spread on the SAW device can be expected to alter the surface wave velocity. When used as a resonator the fractional shift of the resonant frequency is always equal to the fractional change in the surface wave velocity. Following the approach of Ballantine et. al. (27) through a consideration of power flow the fractional change in the SAW velocity purely due to mass loading can be written as:

$$\frac{\Delta v}{v_0} = -c_m f_0 \frac{\Delta m}{A} \quad (2)$$

where A is the surface area of the SAW device, $f_0$ is the resonant frequency and $c_m$ is a coupling constant characteristic of the substrate as well as the geometry of the device. Similarly, the fractional velocity change due purely to a change in the conductivity is:

$$\frac{\Delta v}{v_0} = -\frac{K^2}{2} \frac{\sigma_s^2}{\sigma_s^2 + (v_0 c_s)^2} \quad (3)$$

The analogous change in the attenuation of the SAW is $$\frac{\Delta \alpha}{k} = \frac{K^2}{2} \frac{v_0 c_s \sigma_s}{\sigma_s^2 + (v_0 c_s)^2} \quad (4)$$

Here $K^2$ is an electromechanical coupling coefficient, $\sigma_s$ is the sheet conductivity of the deposited material, k is the wave vector, and $c_s = \in_0 + \in_s$ where $\in_0$ and $\in_s$ are the permittivity of free space and of the substrate, respectively.

A third physical property of the deposited material, the viscoelastic properties of the film, can also affect the SAW. For an elastic film the motion at the top of the film lags behind that at the substrate. (28) In this case, the film acts as a mechanical impedance. For an acoustically thin film $$\frac{\Delta v}{v_0} = -\omega h \left[ c_1 \left( \rho_v - \frac{\mu}{\lambda} \right) + c_2 \rho_v + c_3 \left( \rho_v - \frac{4\mu}{v_0^2} \frac{\lambda + \mu}{\lambda + 2\mu} \right) \right] \quad (5)$$

where $\rho_v$ is the volumetric density; $\lambda$ and $\mu$ are the Lamè Constants. Equation 5 shows the elastic term has the opposite sign from the mass loading term.

There are some noteworthy consequences of all the equations above. Since Equation 2 is dependent on frequency and Equation 3 is not, this enables the separation of the mass loading and electromechanical contributions by employing devices with different resonant frequencies. Since the acoustoelectric effect depends on $K^2$, it can be minimized by choosing a substrate with a low coupling coefficient. Thin, rigid films or isolated nanoentities of very small mass, as in the work reported in this article, avoid viscoelastic effects. Similarly, free standing particles do not have a sheet resistance and, hence, make a negligible contribution to the acoustoelectric effect. Furthermore, we verify this to be true by performing measurements with SAW devices of two different frequencies and observing the proper scaling (see discussion with reference to FIG. 19).

Figure 20:
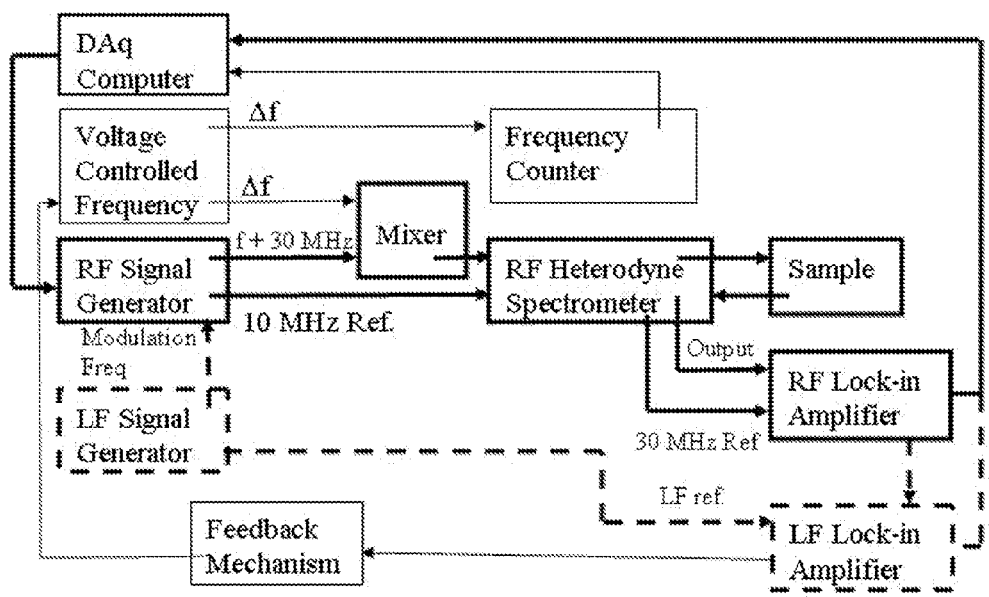
FIG. 20 schematically illustrates the measurement method. The solid bold lines represent the devices used during rf measurements, while the dashed bold lines represent those used during the fm method. Those components enclosed in thin solid lines are added while tracking the resonant frequency of the SAWs during dynamic measurements.
Figure 21:
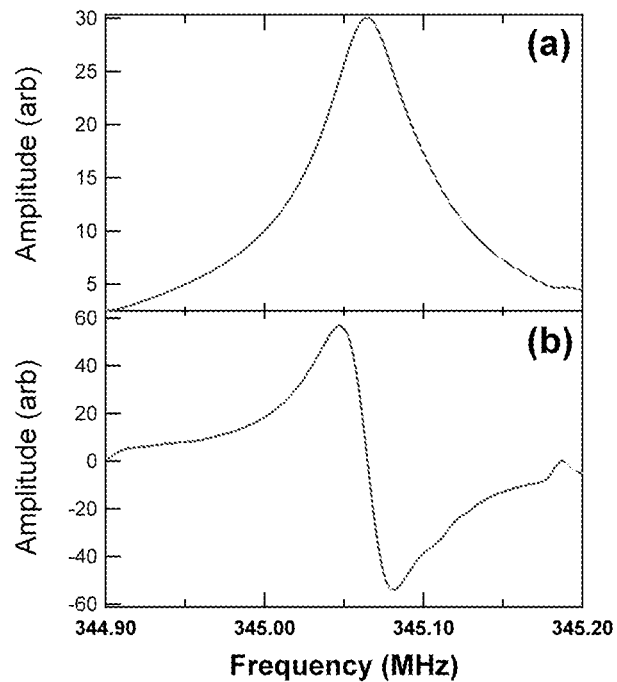
FIG. 21(a) graphically illustrates the typical amplitude response of a SAWR with respect to signal generator frequency.
FIG. 21(b) graphically illustrates the typical amplitude response using the fm method versus rf signal generator frequency.

Modern lithography technology permits fabrication of SAW devices operating in the 100s MHz range quite easily. We used RF Monolithics RP1239 SAWR and RF1171 SAWDL operating at 315 MHz and 418 MHz respectively. To measure the frequency response of the SAWR, a rf heterodyne spectrometer capable of operation in the range 10 MHz to 500 MHz was built. (29) FIG. 20 shows a schematic of the measurement setup. The solid bold lines represent the devices used during rf measurements, while the dashed bold lines represent those used during the fm method. Those components enclosed in thin solid lines are added while tracking the resonant frequency of the SAWs during dynamic measurements. The signal generator is a Fluke 6060B RF Synthesizer, and the Lock-in Amplifier is from Stanford Research Systems SR844 RF. The rf lock-in is used to detect the 30 MHz intermediate frequency (IF). A typical rf response obtained from the RP1239 315 MHz SAWRs is shown in FIG. 21(a), which is a graphical illustration of a typical amplitude response of a SAWR with respect to signal generator frequency. A computer records the frequency response by changing the frequency of the Fluke and reading the output of the lock-in. Sensitivity can be increased through frequency modulation (fm) of the rf signal. To perform this, a Stanford Research Systems SR530 Lock-in Amplifier is attached to the output of the SR844, and a Stanford Research Systems DS345 Function Generator supplies the modulation frequency to the rf generator. Additionally, the DS345 frequency is used as the reference for the SR530 lock-in amplifier. The measurement mode is selected in the data acquisition software.

The fm response works in the following way. The fm signal samples the response of the SAWR about the carrier frequency. As a result, the amplitude of the resonance curve is probed at the modulation frequency. As the carrier frequency nears the resonant frequency, the rf amplitude starts to decrease, resulting in a component of the signal at twice the modulation frequency. Additionally, as the frequency increases past the resonant frequency the response is phase shifted by 180° compared to those below resonance, giving a negative value for amplitude at the modulation frequency. Consequently, this method gives the derivative of the resonant curve. FIG. 21(b) graphically illustrates the response of the SAWR measured using the fm technique versus rf signal generator frequency. The response is measured by reading the output of a lock-in amplifier while sweeping the frequency.

While the methods described above are valid for static situations, most mass loading measurements occur during an active process such as through ablation or hydrogen gas uptake. As a result, a dynamic method that can track the resonant frequency is required. During the course of this research, two methods have been investigated.

Since the SAWR is a resonator, it can be used as the resonant cavity in an oscillator circuit. For an oscillator to operate, two conditions must be met, $$\text{Gain} > 1 \tag{6}$$

and $$\phi = 2\pi N \tag{7}$$

where N is an integer. Equation 6 guarantees the circuit has enough power to oscillate, and Equation 7, ensures that the oscillations are coherent. To satisfy Equations 6 and 7, the circuit must consist of an amplifier and a phase shifting element. (30) Following the design of Schmitt, Allen, and Wright, (31) a NEC UPC2712 2.6 GHz MMIC Amplifier, Minicircuits JSPHS-446 Voltage-Controlled Phase Shifter, and a simple bandpass filter were used to construct a 315 MHz oscillator. A Hewlett-Packard 53132A Frequency Counter with 2 GHz bandwidth measured the oscillator frequency. Since Equations 6 and 7 are met for multiple phase values the phase is chosen where the oscillator frequency equals the resonant frequency as determined using the rf spectrometer.

Figure 22:
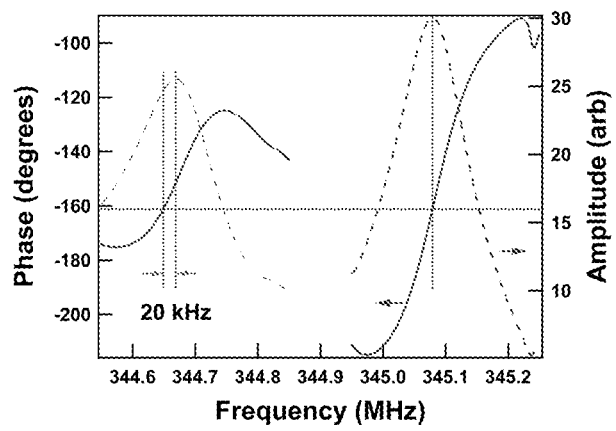
FIG. 22 graphically illustrates the phase shift of SAW device after ablation. The high frequency curve shows the SAW response before ablation, while the low frequency one is after ablation. The black dashed lines illustrate how the phase at the peak changes during ablation.

However, we have noticed that there can be problems in using an oscillator to accurately track resonant frequency changes. During ablation the phase of the SAWR can change and cause a "phase shifting" problem. FIG. 22 graphically illustrates the phase shift of SAW device after ablation. The high frequency curve shows the SAW response before ablation, while the low frequency one is after ablation. The black dashed lines illustrate how the phase at the peak changes during ablation. In this case, the original peak phase is 20 kHz lower than the post ablation peak phase. As shown in FIG. 22 the "phase" provided by the maximum in the SAW response before ablation does not correspond to the phase provided by the maximum of the response after ablation. The frequency has shifted so Equations 6 and 7 are met, but the zero-phase no longer matches the resonant peak. Consequently, oscillators although widely employed can yield unreliable results. The method described next is therefore preferable.

As described earlier, the resonant frequency occurs at a zero crossing with the fm method. Therefore, a feedback loop can be used to track the resonant frequency. By mixing a fixed rf signal with a voltage-controlled frequency (VCF) a sum or difference frequency equal to the resonant frequency can be produced. As the resonant frequency shifts due to the added mass, the VCF follows the shift in accordance. FIG. 20 shows how the VCF configuration is set up for these measurements. For this work the VCF is a Wavetek 187 Frequency Generator. The feedback mechanism is a summing amplifier that adds the output of the lock-in amplifier to a dc voltage set by the computer. The HP53132A frequency counter is used to measure the frequency of the VCF.

Figure 23:
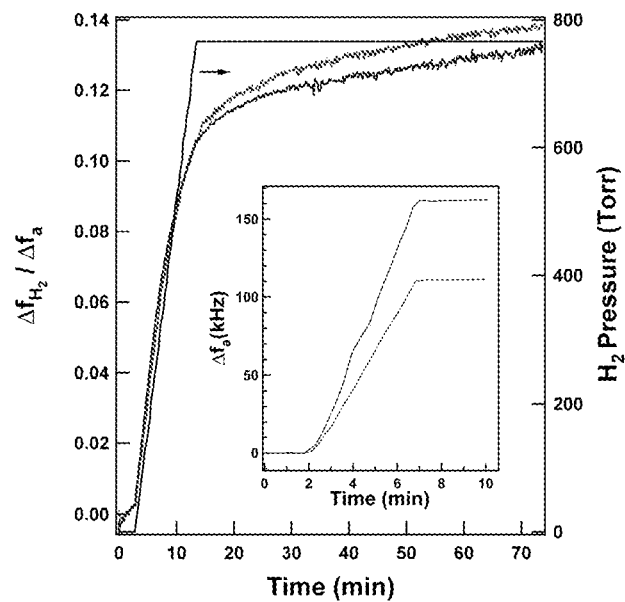
FIG. 23 graphically illustrates the response of transition metal-ethylene complex when exposed to hydrogen. This figure shows the fractional frequency shift due to hydrogen uptake in the transition metal-ethylene complexes as measured by the 315 RP1239 SAWR (red) and the 418 MHz RF1171 SAWDL (blue). The hydrogen pressure in the chamber is shown by the black line. The inset shows the frequency shifts during ablation. These shifts scale according to the resonant frequency thus demonstrating the SAWs are responding exclusively to mass loading.
Figure 24:
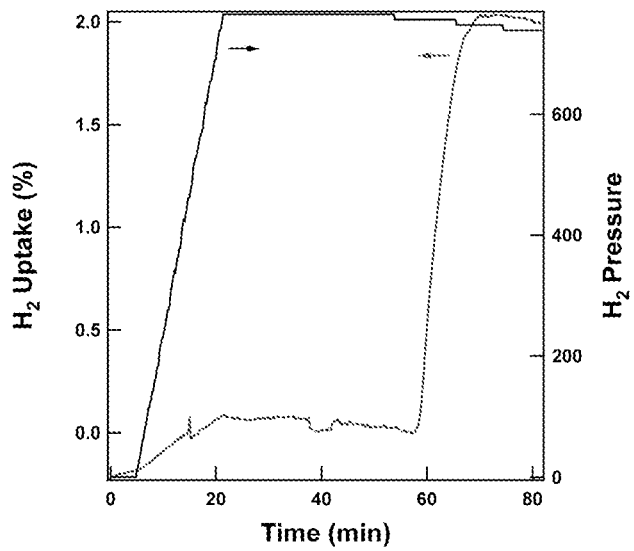
FIG. 24 graphically illustrates hydrogen absorption in samarium nanoparticles, which is a well-characterized material.

An example of the data we obtain is shown in FIG. 23, which graphically illustrates the response of transition metal-ethylene nanomaterial when exposed to hydrogen. This figure shows the fractional frequency shift due to hydrogen uptake in the transition metal-ethylene nanomaterials as measured by the 315 RP1239 SAWR (red) and the 418 MHz RF1171 SAWDL (blue). The hydrogen pressure in the chamber is shown by the black line. The inset shows the frequency shifts obtained during deposition of the complex using the same two devices. These shifts scale according to the resonant frequency thus demonstrating the SAWs are responding exclusively to mass loading. While these shifts (due to the mass of the complex) are different for the two devices the fractional frequency shifts due to hydrogen absorption are the same. A second example of the results obtained is shown in FIG. 24 which exhibits the hydriding of samarium nanoparticles at room temperature. The percentage of hydrogen absorbed is consistent with the formation of the chemical hydride $SmH_3$. The large time delay observed prior to the onset of hydrogenation is similar to that observed by other workers who performed their measurements on bulk (1 gram) samarium. (32) After 37 minutes under one atmosphere of hydrogen, 2% hydrogen by weight is absorbed by approximately 40 nanogram samples.

In conclusion we have described an apparatus which can measure the hydrogen absorption in isolated nanostructures scattered on a SAW resonator. The absolute mass sensitivity attainable with this apparatus using 315 MHz resonators has been determined through an independent mass measurement obtained from scanning electron microscopy pictures of the deposited isolated nanoparticles. We are able to resolve picogram level mass changes are quite easily without temperature control of the SAWRs. With improvements in temperature stability of both the SAW sensor and the reference oscillator of the rf spectrometer we should be able to detect a change in mass at the femtogram level. With such a resolution in addition to studies on hydrogen in nanomaterials, this apparatus should open up a new class of experiments on mass changes associated with catalysis on isolated nanoparticles.

Unless clearly specified to the contrary, there is no requirement for any particular described or illustrated activity or element, any particular sequence or such activities, any particular size, speed, material, duration, contour, dimension or frequency, or any particularly interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. It should be appreciated that aspects of the present invention may have a variety of sizes, contours, shapes, compositions and materials as desired or required.

In summary, while the present invention has been described with respect to specific embodiments, many modifications, variations, alterations, substitutions, and equivalents will be apparent to those skilled in the art. The present invention is not to be limited in scope by the specific embodiment described herein. Indeed, various modifications of the present invention, in addition to those described herein, will be apparent to those of skill in the art from the foregoing description and accompanying drawings. Accordingly, the invention is to be considered as limited only by the spirit and scope of the following claims, including all modifications and equivalents.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application. For example, regardless of the content of any portion (e.g., title, field, background, summary, abstract, drawing figure, etc.) of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Unless clearly specified to the contrary, there is no requirement for any particular described or illustrated activity or element, any particular sequence or such activities, any particular size, speed, material, dimension or frequency, or any particularly interrelationship of such elements. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

REFERENCES

The following references as cited throughout this document are hereby incorporated by reference in their entirety herein.
(1) Metal Dihydrogen and Bond Complexes-Structure, Theory and Reactivity, edited by G. J. Kubas (Kluwer Academic/Plenum Publishing, New York, 2001
(2) See, e.g., O. Gülseren, T. Yildirim, and S. Ciraci, Phys. Rev. Lett, 87, 2001; Yufeng Zhao, Yong-Hyun Kim, A. C. Dillon, M. J. Heben, and S. B. Zhang, Phys. Rev. Lett., 94, 155504, (2005); T. Yildirim, Jorge Iñiguez, and S. Ciraci, Phys. Rev. B 72, 153403, 2005; Qiang Sun, Punt Jena, Qian Wang, and Manuel Marquez, J. Amer. Chem. Soc., 128, 9741-9745, 2006; Yong-Hyun Kim, Yufeng Zhao, Andrew Williamson, Michael J. Heben, and S. B. Zhang, Phys. Rev. Lett., 96, 016102 (2006); N. Akman, E. Durgun, T. Yildirim, and S. Ciraci, J. Phys., Cond. Mat. 18, 9509 (2006); Hoonkyung Lee, Woon Ih Choi, and Jisoon Ihm, Phys. Rev. Lett., 97, 056104 (2006).
(3) S. Li and P. Jena, Phys. Rev. Lett., 97, 209601 (2006).
(4) Durgun, S. Ciraci, W. Zhou, and T. Yildirim, Phys. Rev. Lett., 97, 226102 (2006); W. Zhou, T. Yildirim, E. Durgun and S. Ciraci, Phys. Rev. B 76, 085434 (2007).
(5) Durgun, S. Ciraci, W. Zhou, and T. Yildirim, Phys. Rev. Lett., 97, 226102 (2006). W. Zhou, T. Yildirim, E. Durgun and S. Ciraci, Phys. Rev. B 76, 085434 (2007); Philippe F. Wecka, T. J. Dhilip Kumar, Eunja Kim, and Naduvalath Balakrishnan, "Computational study of hydrogen storage in organometallic compounds", J. of Chem. Phys., 126, 094703, 2007; Yufeng Zhao, Yong-Hyun Kim, A. C. Dillon, M. J. Heben, and S. B. Zhang, "Hydrogen Storage in Novel Organometallic Buckyballs", Phys. Rev. Lett., 94, 155504 (2005); Qiang Sun, Punt Jena, Qian Wang, and Manuel Marquez, "First-Principles Study of Hydrogen Storage on Li12C60", J. Amer. Chem. Soc., 128, 9741-9745, 2006.
(6) Yu Kang Lee, Laurent Manceron, Imre Papai, J. Phys. Chem. A, 101, 9650-9659, 1997
(7) Paul S. Cremer, Xingcai Su, Y. R. Shen, and Gabor A. Somorjai, J. Amer. Chem. Soc., 118, 2942-2949, 1996.
(8) H.-G. Cho and L. Andrews, J. Phys. Chem. A 108, 6272 (2004). G. A. Ozin, W. J. Power, T. H. Upton, and W. A. Goddard III, J. Am. Chem. Soc. 100, 4750, (1978). Y. K. Lee, L. Manceron, and I. Papai, J. Phys. Chem. A 101 9650 (1997).
(9) T. A. Land, T. Michely, R. J. Behm, J. C. Hemminger, and G. Comsa, J. Chem. Phys. 97, 6774 (1992); F. Zaera and C. French, J. Am. Chem. Soc. 121, 2236 (1999); L. H. Dubois, D. G. Castner, and G. A. Somorjai, J. Chem. Phys. 72, 5234 (1980).
(10) P. S. Cremer, X. Su, Y. R. Shen, and G. A. Somorjai, J. Am. Chem. Soc. 118, 2942 (1996).
(11) D. Ritter, J. J. Carroll, and J. C. Weisshaar, J. Phys. Chem. 96, 10636 (1992). J. J. Carroll, K. L. Huog, and J. C. Weisshaar, J. Am. Chem. Soc. 115, 6962 (1993). J. J. Carroll, K. L. Huog, J. C. Weisshaar, M. R. A. Blomberg, P. E. M. Siegbahn, and M. Svensson, J. Phys. Chem. 99, 13955 (1995). P. A. Willis, H. U. Stauffer, R. Z. Hinricks, and H. F. Davis, J. Phys. Chem. A 103, 3706 (1999).
(12) F. Zaera and C. French, J. Am. Chem. Soc. 121, 2236 (1999); P. S. Cremer, X. Su, Y. R. Shen, and G. A. Somorjai, J. Am. Chem. Soc. 118, 2942 (1996); H. H. Hwu and J. G. Chen, J. Phys. Chem. 107, 11467 (2003).
(13) H.-G. Cho and L. Andrews, J. Phys. Chem. A 108, 6272 (2004); Y. K. Lee, L. Manceron, and I. Pápai, J. Phys. Chem. A 101 9650 (1997).
(14) J. J. Carroll, K. L. Huog, and J. C. Weisshaar, J. Am. Chem. Soc. 115, 6962 (1993); J. J. Carroll, K. L. Huog, J. C. Weisshaar, M. R. A. Blomberg, P. E. M. Siegbahn, and M. Svensson, J. Phys. Chem. 99, 13955 (1995).
(15) Louis Schlapbach, & Andreas Züttel, Nature, 414, 23, 2001; G. W. Crabtree, M. S. Dresselhaus, and M. V. Buchanan, Phys. Today 57, No. 12, 39 (2004); Sunita Satyapal, John Petrovic and George Thomas, Scientific American, April 2007, p. 81.
(16) Durgun, S. Ciraci, W. Zhou, and T. Yildirim, Phys. Rev. Lett., 97, 226102 (2006); W. Zhou, T. Yildirim, E. Durgun and S. Ciraci, Phys. Rev. B 76, 085434 (2007); Philippe F. Wecka, T. J. Dhilip Kumar, Eunja Kim, and Naduvalath Balakrishnan, "Computational study of hydrogen storage in organometallic compounds", J. of Chem. Phys., 126, 094703, 2007.
(17) B. C. Guo, K. P. Kerns, and A. W. Castleman Jr., J. Phys. Chem. 1992, 96, 4879-4883; B. C. Cuo, K. P. Kerns, and A. W. Castleman, Jr., Science, 255, 1411, 1992.
(18) B. Kiran, Anil Kandalam and P. Jena, J. Chem Phys., 124, 224703 (2006).
(19) G. S. Fu, Y. L. Wan, L. Z. Chu, Y Zhou, W. Yu, L. Han, and Y. C. Peng, Europhys. Lett, 69, 758, (2005).
(20) Philippe F. Wecka, T. J. Dhilip Kumar, Eunja Kim, and Naduvalath Balakrishnan, "Computational study of hydrogen storage in organometallic compounds", J. of Chem. Phys., 126, 094703, 2007.
(21) A. Krozer and B. Kasemo, J. Less-Common Metals 160, 323 (1990); P. Hjort, A. Krozer, B. Kasemo, J. Alloys Compd. 234, L11 (1996); K. Papathanassopoulos and H. Wenzl, J. Phys. F: Met. Phys. 12, 1369 (1982).
(22) A. Krozer and B. Kasemo, J. Less-Common Metals 160, 323 (1990); P. Hjort, A. Krozer, B. Kasemo, J. Alloys Compd. 234, L11 (1996); K. Papathanassopoulos and H. Wenzl, J. Phys. F: Met. Phys. 12, 1369 (1982).
(23) T. Ono, X. Li, H. Miyashita, and M. Esashi, Rev. Sci. Instrum. 74, 1240 (2003).
(24) K. Srinivasan, S. Cular, V. R. Bhethanabotla, S. Y. Lee, M. T. Harris, and J. N. Culver, IEEE Ultrasonics Symp. 645 (2005).
(25) D. S. Ballantine, R. M. White, S. J. Martin, A. J. Ricco, E. T. Zellers, G. C. Frye, and H. Wohltjen, *Acoustic Wave Sensors: Theory, Design, and Physico-Chemical Applications*, (Academic Press, San Diego, 1997).

(26) D. S. Ballantine, R. M. White, S. J. Martin, A. J. Ricco, E. T. Zellers, G. C. Frye, and H. Wohltjen, *Acoustic Wave Sensors: Theory, Design, and Physico-Chemical Applications*, (Academic Press, San Diego, 1997); A. Z. Sadek, C. O. Baker, D. A. Powell, W. Wlodarski, R. B. Kaner, and K. Kalantar-zadeh, IEEE Sensors Journal, 7, 213 2007; A. J. Ricco, A. W. Staton, R. M. Crooks, and T. Kim, Faraday Discuss. 107, 247 (1997); E. Milella and M. Penza, Thin Solid Films 327-329, 694 (1998).

(27) D. S. Ballantine, R. M. White, S. J. Martin, A. J. Ricco, E. T. Zellers, G. C. Frye, and H. Wohltjen, *Acoustic Wave Sensors: Theory, Design, and Physico-Chemical Applications*, (Academic Press, San Diego, 1997).

(28) S. L. Hietala, V. M. Hietala, and C. J. Brinker, IEEE Trans. Ultrasonics, Ferroelectrics, and Freq. Control 48, 262 (2001).

(29) A. A. V. Gibson, J. R. Owers-Bradley, I. D. Calder, J. B. Ketterson, and W. P. Halperin, Rev. Sci. Instrum. 52, 1509 (1981).

(30) K. Srinivasan, S. Cular, V. R. Bhethanabotla, S. Y. Lee, M. T. Harris, and J. N. Culver, IEEE Ultrasonics Symp. 645 (2005).

(31) R. F. Schmitt, J. W. Allen, and R. Wright, Sens. Actuators B76, 80 (2001).

(32) K. Hirano, J. Kadano, S. Yamamoto, T. Tanabe and H. Miyake, J. Alloys and Compounds, 408-412, 351 (2006).

We claim:

1. A process for producing a hydrogen storage material comprising:
Vaporizing a transition metal or lithium in a pi-bond gas such that 1 to 100 bonding collisions occur between the atoms of said transition metal or lithium and the pi-bond gas before resulting bonding product is collected.

2. The process for producing a hydrogen storage material of claim 1, wherein said material can exhibit a $H_2$ uptake of greater than zero at any temperature up to desorption temperature.

3. The process for producing a hydrogen storage material of claim 1, wherein said transition metal is either Titanium, Scandium, Vanadium, Iron, or Nickel.

4. The process for producing a hydrogen storage material of claim 3, wherein said material can exhibit a $H_2$ uptake of greater than zero at any temperature up to desorption temperature.

5. The process for producing a hydrogen storage material of claim 1, wherein said pi-bond gas is ethylene, benzene, or acetylene.

6. The process for producing a hydrogen storage material of claim 5, wherein said material can exhibit a $H_2$ uptake of greater than zero at any temperature up to desorption temperature.

7. The process for producing a hydrogen storage material of claim 1, wherein said transition metal is either Titanium, Scandium, Vanadium, Iron, or Nickel and said pi-bond gas is ethylene, benzene, or acetylene.

8. The process for producing a hydrogen storage material of claim 7, wherein said material can exhibit a $H_2$ uptake of greater than zero at any temperature up to desorption temperature.

9. The process for producing a hydrogen storage material of claim 1, wherein said transition metal is Titanium, Nickel, Niobium, Iron, or Vanadium and said pi-bond gas is ethylene.

10. The process for producing a hydrogen storage material of claim 9, wherein said pi-bond gas is supplied at a pressure is set between 0 and 760 Torr.

11. The process for producing a hydrogen storage material of claim 10 wherein distance from the titanium, nickel, niobium, iron or vanadium is approximately 2 inches away from where said resulting bonded product is collected.

12. The process for producing a hydrogen storage material of claim 11, wherein an incidental energy used to vaporize the titanium, nickel, niobium, iron, or vanadium ranges from the lowest possible vaporization power up to approximately 2.5 Watts.

13. The process for producing a hydrogen storage material of claim 12, wherein said material can exhibit a $H_2$ uptake of greater than zero at any temperature up to desorption temperature.

14. The process for producing a hydrogen storage material of claim 1, wherein said transition metal is Titanium and said pi-bond gas is benzene.

15. The process for producing a hydrogen storage material of claim 14, wherein said pi-bond gas is supplied at a pressure is set between 0 and 760 Torr.

16. The process for producing a hydrogen storage material of claim 15, wherein distance from the titanium is approximately 2 inches away from where said resulting bonded product is collected.

17. The process for producing a hydrogen storage material of claim 16, wherein an incidental energy used to vaporize the titanium ranges from the lowest possible vaporization power up to approximately 2.5 Watts.

18. The process for producing a hydrogen storage material of claim 17, wherein said material can exhibit a $H_2$ uptake of greater than zero at any temperature up to desorption temperature.

* * * * *